US012426289B2

(12) United States Patent
Sato et al.

(10) Patent No.: US 12,426,289 B2
(45) Date of Patent: Sep. 23, 2025

(54) SEMICONDUCTOR DEVICE

(71) Applicant: FUJI ELECTRIC CO., LTD., Kanagawa (JP)

(72) Inventors: Shigeki Sato, Azumino (JP); Soichi Yoshida, Matsumoto (JP); Kouji Asahi, Shiojiri (JP); Seiji Momota, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 513 days.

(21) Appl. No.: 17/680,270

(22) Filed: Feb. 24, 2022

(65) Prior Publication Data
US 2022/0328668 A1 Oct. 13, 2022

(30) Foreign Application Priority Data

Apr. 8, 2021 (JP) ................. 2021-065973

(51) Int. Cl.
*H10D 12/00* (2025.01)
*G01K 7/01* (2006.01)
(Continued)

(52) U.S. Cl.
CPC ............. *H10D 12/481* (2025.01); *G01K 7/01* (2013.01); *H01L 23/528* (2013.01); *H10D 62/127* (2025.01); *H10D 64/519* (2025.01)

(58) Field of Classification Search
CPC .............. H01L 29/7397; H01L 23/528; H01L 29/0696; H01L 29/4238; H01L 29/16; H01L 29/861; H01L 29/8613; H01L 27/0629; H01L 29/0619; H01L 29/417; H01L 27/0727; H01L 29/407; H01L 29/4236; G01K 7/01; G01K 7/015
See application file for complete search history.

(56) References Cited

U.S. PATENT DOCUMENTS 10,529,814 B2    1/2020 Naito
10,643,992 B2 *  5/2020 Naito ............... H10D 62/133
(Continued)

FOREIGN PATENT DOCUMENTS

JP    2004128371 A    4/2004
JP    2010010263 A    1/2010
(Continued)

OTHER PUBLICATIONS

Office Action issued for counterpart Japanese Application No. 2021-065973, transmitted from the Japanese Patent Office on Feb. 4, 2025 (drafted on Jan. 28, 2024).

*Primary Examiner* — Steven B Gauthier
*Assistant Examiner* — Khatib A Rahman

(57) ABSTRACT

Provided is a semiconductor device including: a first trench portion having a predetermined first trench length; a second trench portion having a second trench length longer than the first trench length; a first gate runner portion configured to be electrically connected to an end portion of the first trench portion; and a second gate runner portion configured to be electrically connected to the first gate runner portion and electrically connected to an end portion of the second trench portion. A resistivity per unit length of the first gate runner portion is larger than a resistivity per unit length of the second gate runner portion.

20 Claims, 19 Drawing Sheets

(51) Int. Cl.
*H01L 23/528* (2006.01)
*H10D 62/10* (2025.01)
*H10D 64/27* (2025.01)

(56) References Cited

U.S. PATENT DOCUMENTS

| | | |
|---|---|---|
| 10,957,758 B2 | 3/2021 | Naito |
| 10,985,158 B2 | 4/2021 | Naito |
| 11,239,234 B2 | 2/2022 | Obata |
| 11,239,355 B2 | 2/2022 | Naito |
| 2015/0311285 A1 | 10/2015 | Momota |
| 2018/0204910 A1 | 7/2018 | Mitamura |
| 2019/0252374 A1* | 8/2019 | Kanetake ............ H10D 84/617 |
| 2020/0058735 A1 | 2/2020 | Naito |
| 2020/0161457 A1 | 5/2020 | Takahashi et al. |
| 2020/0185520 A1* | 6/2020 | Imagawa ............... H10D 8/422 |
| 2020/0365715 A1* | 11/2020 | Yoshida ............... H10D 84/811 |
| 2020/0395215 A1* | 12/2020 | Kubouchi ............. H10D 62/60 |

FOREIGN PATENT DOCUMENTS

| | | |
|---|---|---|
| JP | 2015207736 A | 11/2015 |
| JP | 2017103400 A | 6/2017 |
| JP | 2018117025 A | 7/2018 |
| JP | 2019068036 A | 4/2019 |
| JP | 2019161126 A | 9/2019 |
| JP | 2019161168 A | 9/2019 |
| JP | 2020088239 A | 6/2020 |
| WO | 2019078166 A1 | 4/2019 |
| WO | 2019098271 A1 | 5/2019 |
| WO | 2019116696 A1 | 6/2019 |
| WO | 2019159391 A1 | 8/2019 |

\* cited by examiner

SEMICONDUCTOR DEVICE

The contents of the following Japanese patent application(s) are incorporated herein by reference:

NO. 2021-065973 filed in JP on Apr. 8, 2021

BACKGROUND

1. Technical Field

The present invention relates to a semiconductor device.

2. Related Art

Conventionally, semiconductor devices such as insulated gate bipolar transistors (IGBTs) are known (see, for example, Patent Documents 1 and 2).

Patent Document 1: Japanese Patent Application Publication No. 2017-103400

Patent Document 2: Japanese Patent Application Publication No. 2015-207736

DESCRIPTION OF EXEMPLARY EMBODIMENTS

Figure 1:
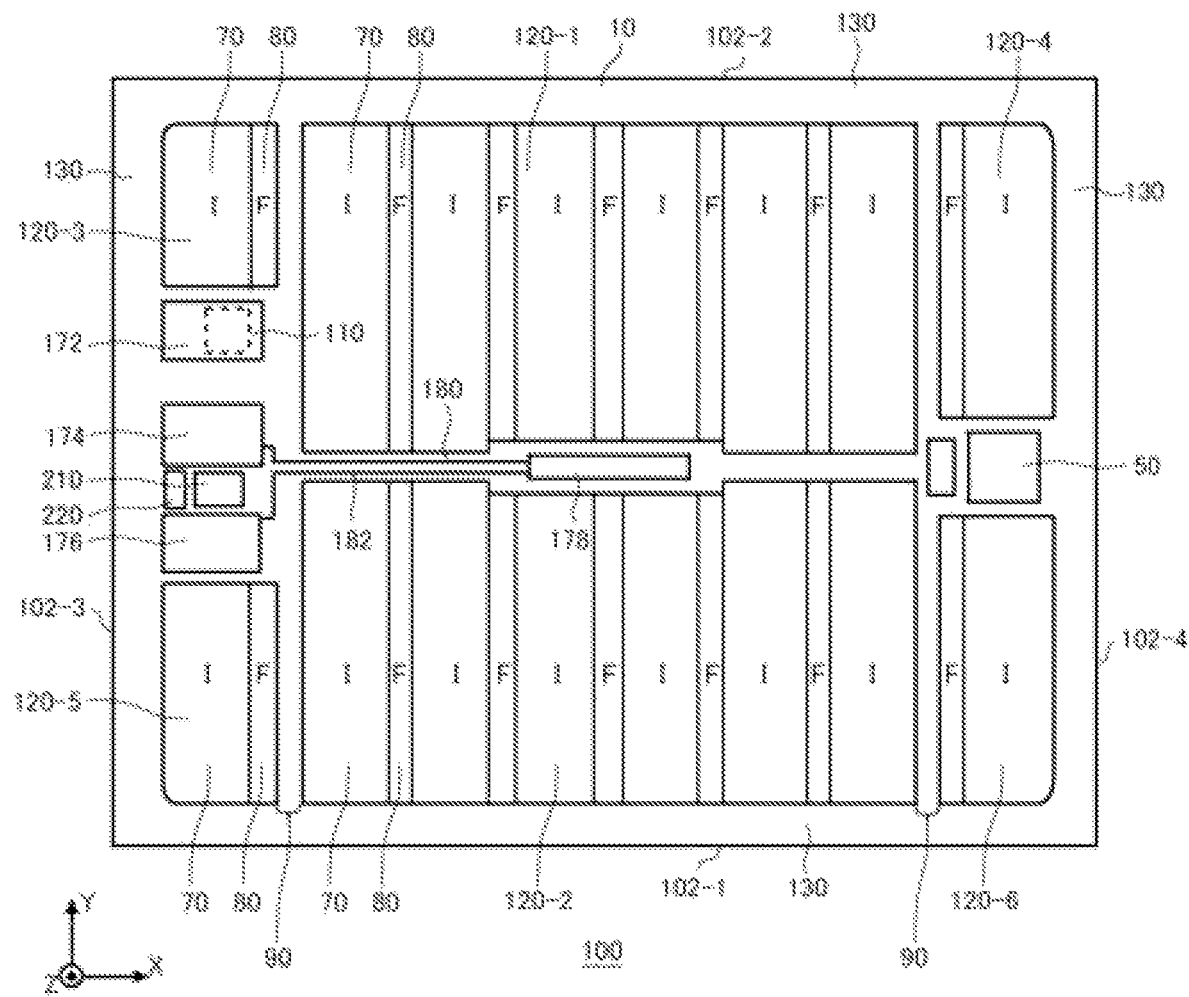
FIG. 1 illustrates an example of an arrangement of each component on the front surface of a semiconductor device 100 according to an example embodiment 1.

Hereinafter, the present invention will be described through embodiments of the invention, but the following embodiments do not limit the invention according to the scope of the claims. In addition, not all combinations of features described in the embodiments are essential to the solution of the invention.

As used herein, one side in a direction parallel to a depth direction of a semiconductor substrate is referred to as "front" or "upper" and the other side is referred to as "back" or "lower". One surface of two principal surfaces of a substrate, a layer or other member is referred to as an upper surface, and the other surface is referred to as a lower surface. "Front", "upper", "back", and "lower" directions are not limited to a direction of gravity, or directions in which a semiconductor device is mounted.

In the present specification, technical matters may be described using orthogonal coordinate axes of an X axis, a Y axis, and a Z axis. The orthogonal coordinate axes merely specify relative positions of components, and do not limit a specific direction. For example, the Z axis is not limited to indicate the height direction with respect to the ground. Note that a +Z axis direction and a −Z axis direction are directions opposite to each other. When the Z axis direction is described without describing the signs, it means that the direction is parallel to the +Z axis and the −Z axis. In addition, in the present specification, viewing from the +Z axis direction may be referred to as a top view.

In the present specification, a case where a term such as "same" or "equal" is mentioned may include a case where an error due to a variation in manufacturing or the like is included. The error is, for example, within 10%.

In the present specification, a conductivity type of doping region where doping has been carried out with an impurity is described as a P type or an N type. However, the conductivity type of each doping region may have opposite polarities. In addition, in the present specification, a description of a P+ type or an N+ type means a higher doping concentration than that of the P type or the N type, and a description of a P− type or an N− type means a lower doping concentration than that of the P type or the N type.

In the present specification, the doping concentration refers to the concentration of the donor or acceptor dopant. In the present specification, the concentration difference between the donor and the acceptor may be set as the higher concentration of the donor or the acceptor. The concentration difference can be measured by capacitance-voltage profiling (CV profiling). In addition, the carrier concentration measured by spreading resistance profiling method (SRP) may be set as the donor or acceptor concentration. In addition, in a case where the concentration distribution of the donor or acceptor has a peak, the peak value may be set as the concentration of the donor or acceptor in the region. In a case where the concentration of the donor or acceptor in the region where the donor or acceptor is present is substantially uniform or the like, the average value of the donor concentration or acceptor concentration in the region may be set as the donor concentration or acceptor concentration.

FIG. 1 illustrates an example of arrangement of each component in the front surface of a semiconductor device 100 according to the example embodiment 1. The semiconductor device 100 includes a semiconductor substrate 10, a gate pad 50, a current sense pad 172, a temperature sense portion 178, an anode pad 174 and a cathode pad 176 electrically connected to the temperature sense portion 178, a bidirectional diode portion 210, and an output comparison diode portion 220. The region provided with the current sense pad 172, the anode pad 174, the cathode pad 176, the bidirectional diode portion 210, and the output comparison diode portion 220 may be collectively referred to as a pad region.

The semiconductor substrate 10 has an end side 102. In the present specification, the direction of one end side 102-1 of the semiconductor substrate 10 in a top view of FIG. 1 is set as the X axis, and the direction perpendicular to the X axis is set as the Y axis. In the present example, the X axis is taken in the direction of the end side 102-1. In addition, a direction that is perpendicular to the X axis direction and the Y axis direction and forms a right-handed system is referred to as the Z axis direction. The temperature sense portion 178 of the present example is provided in the +Z axis direction of the semiconductor substrate 10.

The semiconductor substrate 10 is provided with a semiconductor material such as silicon or a compound semiconductor. In the semiconductor substrate 10, the side in which the temperature sense portion 178 is provided is referred to as a front surface, and the surface on the opposite side is referred to as a back surface. In the present specification, a direction connecting the front surface and the back surface of the semiconductor substrate 10 is referred to as a depth direction. The semiconductor substrate 10 of the present example has an approximately rectangular shape on the front surface, but may have a different shape.

The semiconductor substrate 10 has an active portion 120 in the front surface. The active portion 120 is a region in which a main current flows in the depth direction between the front surface and the back surface of the semiconductor substrate 10 in a case where the semiconductor device 100 is turned on. A gate conductive portion 44 described later of the active portion 120 is electrically connected to the gate pad 50 by a gate runner portion described later.

The active portion 120 may be disposed by being divided into an active portion 120-1, an active portion 120-2, an active portion 120-3, an active portion 120-4, an active portion 120-5, and an active portion 120-6. In particular, the active portion 120-1, the active portion 120-3, and the active portion 120-4 may be separated in the X axis direction by a separation portion 90, and similarly, the active portion 120-2, the active portion 120-5, and the active portion 120-6 may be separated in the X axis direction by the separation portion 90. In the present example, the active portion 120-1, the active portion 120-2, and the active portion 120-3 disposed apart from each other in the X axis direction are electrically connected to each other by the emitter electrode 52 described later. Similarly, the active portion 120-4, the active portion 120-5, and the active portion 120-6 are also electrically connected to each other by the emitter electrode 52 described later.

The active portion 120 may be provided with a transistor portion 70 including a transistor device such as an IGBT (insulated gate bipolar transistor). The active portion 120 may be provided with a diode portion 80 including a diode device such as an FWD (freewheeling diode). In a case where the active portion 120 is provided with an IGBT and an FWD, the transistor portion 70 and the diode portion 80 form an RC-IGBT (Reverse Conducting IGBT, reverse conduction type IGBT). The active portion 120 may be a region provided with at least one of the transistor portion 70 and the diode portion 80.

In the present example, in the active portion 120, a symbol "I" is attached to the region where the transistor portion 70 is disposed, and a symbol "F" is attached to the region where the diode portion 80 is disposed. The transistor portion 70 and the diode portion 80 may be disposed alternately in the X axis direction in each region of the active portion 120.

However, the arrangement of the transistor portion 70 and the diode portion 80 in the present example is an example, and may be different arrangements. In the active portion 120-3, the diode portion 80 may be disposed on the negative side in the X axis direction.

The semiconductor device 100 has a P+ type well region 130 in the front surface outside the active portion 120. Further outside, it has an edge termination structure portion. The edge termination structure portion has a structure of, for example, a guard ring, a field plate, a RESURF, and a combination thereof, which are provided to surround the active portion 120 in an annular shape.

The temperature sense portion 178 may be disposed in a wide portion provided near the center of the front surface of the semiconductor substrate 10. The active portion 120 is not provided in the wide portion. When the active portion 120 of the semiconductor substrate 10 is integrated, the central portion of the semiconductor substrate 10 is easily heated by heat generated from a switching device formed in the active portion 120. By providing the temperature sense portion 178 in the wide portion near the center, the temperature of the transistor portion 70 can be monitored. As a result, it is possible to prevent the transistor portion 70 from being overheated beyond a junction temperature, which is a normal operating temperature range.

The temperature sense portion 178 may be provided by a temperature sense diode. As an example, the temperature sense portion 178 is provided by a Schottky diode. In addition, the temperature sense portion 178 may be provided by a PN junction diode made of polycrystalline silicon, which is provided above the semiconductor substrate 10 via a dielectric film.

An anode wiring 180 and a cathode wiring 182, each of which is made of metal, are connected to the anode and the cathode of the temperature sense diode, respectively. The anode wiring 180 and the cathode wiring 182 are wirings containing metal such as aluminum. The anode wiring 180 and the cathode wiring 182 are examples of a temperature sense wiring.

The cathode pad 176 is connected to the temperature sense portion 178 via the cathode wiring 182. The anode pad 174 is connected to the temperature sense portion 178 via the anode wiring 180. The cathode pad 176 and the anode pad 174 are electrodes containing metal such as aluminum. The cathode pad 176 and the anode pad 174 are one example of the temperature sense pad.

The current sense pad 172 is electrically connected to a current sense portion 110. The current sense pad 172 is an example of a front surface electrode. The current sense portion 110 has the same structure as the transistor portion 70 of the active portion 120, and simulates the operation of the transistor portion 70. A current proportional to the current flowing through the transistor portion 70 flows through the current sense portion 110. As a result, the current flowing through the transistor portion 70 can be monitored.

Note that the current sense portion 110 is not provided with an emitter region 12 described later, unlike the transistor portion 70. As a result, the current sense portion 110 does not operate as a transistor. The current sense portion 110 is provided with a gate trench portion. The gate trench portion of the current sense portion 110 is electrically connected to the gate runner portion.

The bidirectional diode portion 210 is disposed between the anode pad 174 and the cathode pad 176 in the front surface of the semiconductor device 100. The bidirectional diode portion 210 includes a diode electrically connected in series bidirectionally between the anode pad 174 and the cathode pad 176. The bidirectional diode portion 210 prevents the temperature sense portion 178 from being damaged by electrostatic discharge (ESD).

The output comparison diode portion 220 is provided between the anode pad 174 and the cathode pad 176. The output comparison diode portion 220 is electrically connected to the anode pad 174 and the cathode pad 176. The output comparison diode portion 220 includes an output comparison diode having a direction of the PN junction connected in antiparallel with the PN junction of the temperature sense diode of the temperature sense portion 178.

The output comparison diode of the output comparison diode portion 220 may have the same design as the diode of the temperature sense portion 178 except for the direction of the PN junction. During operation of the semiconductor device 100, no current is applied to the output comparison diode portion 220. An output comparison operation is performed at predetermined intervals. During the output comparison operation, a current is applied to the output comparison diode portion 220. By the output comparison operation, it is possible to grasp the replacement time of the temperature sense diode of the temperature sense portion 178.

A protection diode having the same forward direction as the output comparison diode portion 220 may be provided in parallel with the output comparison diode portion 220. In that case, the protection diode prevents the application of an overvoltage or the inflow of an overcurrent to the temperature sense portion 178 due to noise or the like during the operation of the temperature sense portion 178.

Figure 2:
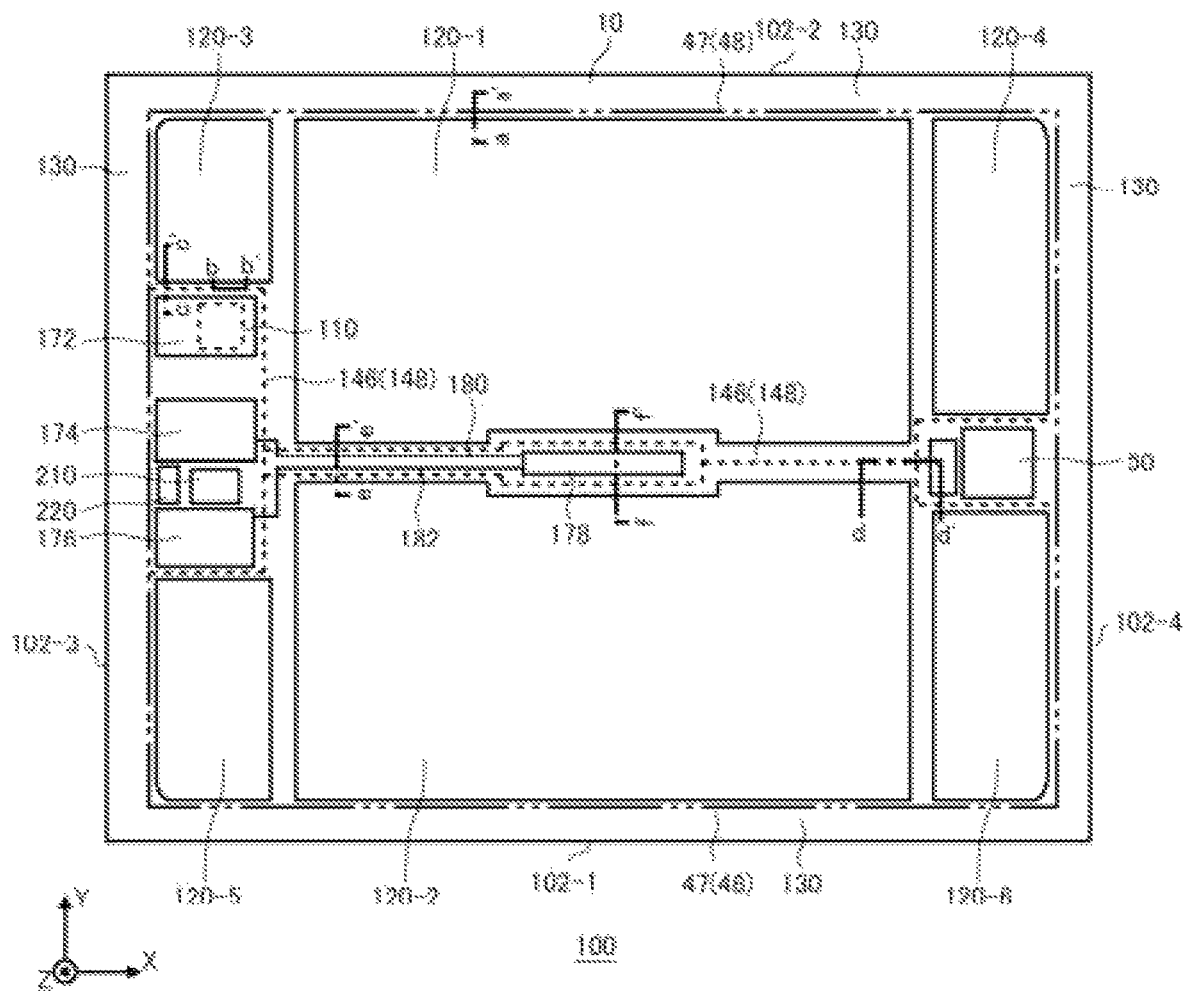
FIG. 2 illustrates an example of an arrangement of a gate runner portion on the front surface of the semiconductor device 100.

FIG. 2 illustrates an example of the arrangement of the gate runner portion in the front surface of the semiconductor device 100. The gate runner portion may be electrically connected to the gate pad 50. Further, the gate runner portion is connected to the gate conductive portion 44 described later of the transistor portion 70 disposed in the active portion 120, and the gate conductive portion 44 is set to a gate potential. The gate conductive portion 44 corresponds to the gate electrode of the transistor portion 70. As a result, the transistor of the transistor portion 70 is switched on.

The gate runner portion includes an outer peripheral gate runner portion 48 that extends the outer periphery of the active portion 120 in an annular shape and an inner gate runner portion 148 that extends between the active portions 120 and is electrically connected to the outer peripheral gate runner portion 48.

The gate runner portion has at least one of a metal wiring and a polysilicon wiring provided below the metal wiring and electrically connected to the metal wiring. The metal wiring is formed by covering a conductive material such as aluminum or an aluminum-silicon alloy with a dielectric film such as polyimide, and the polysilicon wiring is formed by covering polysilicon with impurities added with a dielectric film such as polyimide.

In the present example, the outer peripheral gate runner portion 48 has a metal wiring 47 and a polysilicon wiring 46, and the inner gate runner portion 148 has a polysilicon wiring 146. In FIG. 2, in the front surface of the semiconductor substrate 10, the position where the metal wiring is provided is indicated by a two-dot chain line, and the position where the polysilicon wiring is provided is indicated by a broken line. However, the positions of these wirings in the drawings are merely approximate positions so as not to be confused with other wirings. The detailed position of the gate runner portion will be described later.

The gate runner portion may be disposed above the well region 130 around the active portion 120. The outer peripheral gate runner portion 48 may extend the outer periphery of the active portion 120 in an annular shape. The inner gate runner portion 148 may be disposed together with the outer peripheral gate runner portion 48 so as to surround the pad region, or may be disposed so as to surround the temperature sense portion 178 in the wide portion near the center of the semiconductor substrate 10 which is sandwiched between the active portion 120-1 and the active portion 120-2.

The gate pad 50 is electrically connected to an external control terminal. The gate pad 50 is provided by a metal conductor such as aluminum. The gate pad 50 may be externally connected by wire bonding.

Figure 3:
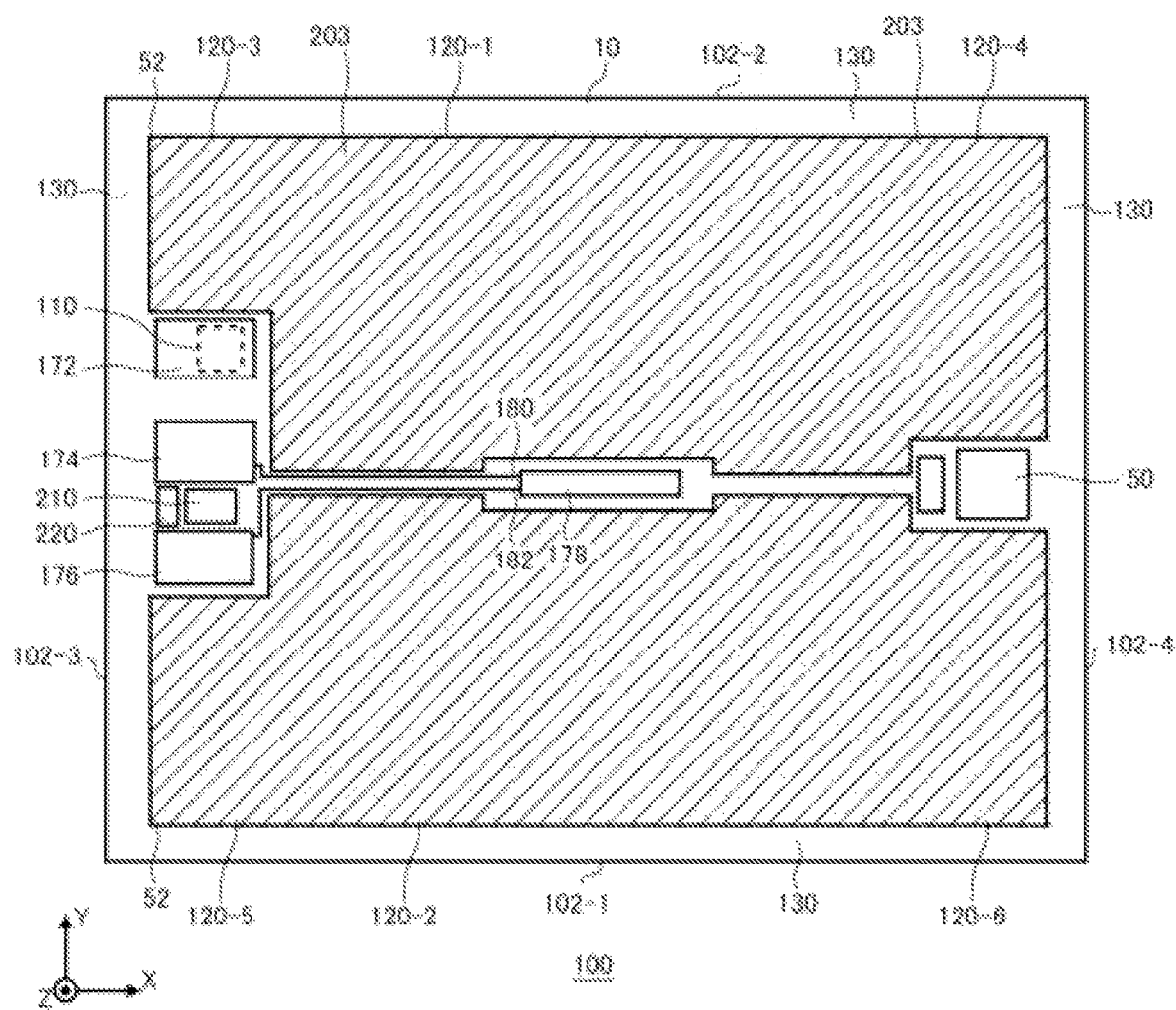
FIG. 3 is an example of an arrangement of an emitter electrode 52 provided in the front surface of the semiconductor device 100.

FIG. 3 is an example of the arrangement of the emitter electrode 52 provided in the front surface of the semiconductor device 100. The emitter electrode 52 is provided by a metal conductor such as aluminum. The emitter electrode 52 is set to an emitter potential, which is a predetermined reference potential.

The emitter potential may be set to the ground potential. The emitter electrode 52 is also an example of a front surface electrode like the current sense pad 172.

The emitter electrode 52 is disposed in the region indicated by oblique lines. The emitter electrode 52 has a main metal portion 203 provided so as to cover the entire active portion 120. Further, the emitter electrode 52 is also provided in a region above the separation portion 90 that separates the active portion 120-1, the active portion 120-3, and the active portion 120-4 from each other in the X axis direction. These active portions are electrically connected to each other by the emitter electrode 52. Similarly, the active portion 120-2, the active portion 120-5, and the active portion 120-6 are also electrically connected to each other by the emitter electrode 52.

Figure 4:
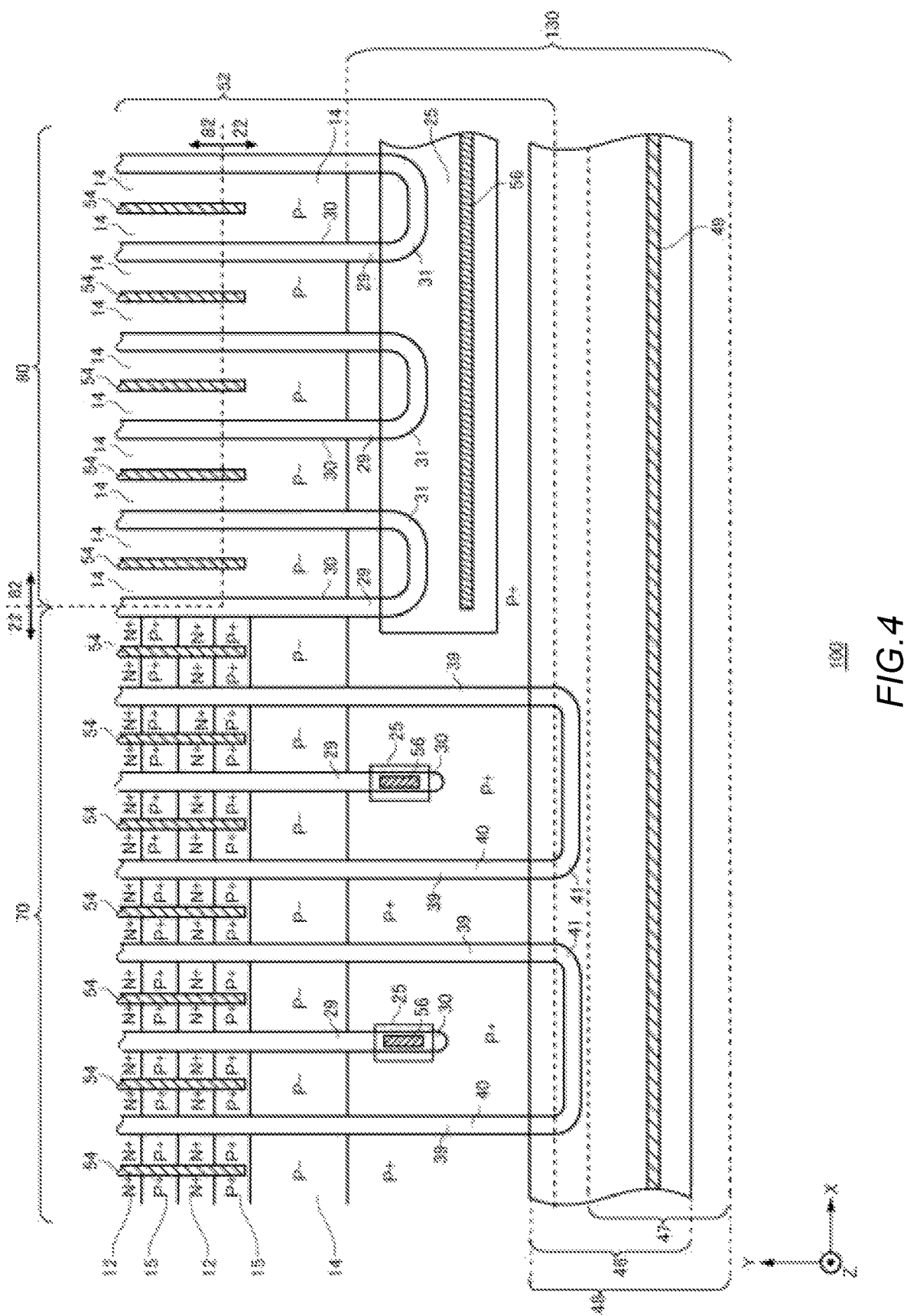
FIG. 4 illustrates an example of a top view of the semiconductor device 100.

FIG. 4 is an example of a top view of the semiconductor device 100. FIG. 4 illustrates the vicinity of the end portion of the active portion 120-2 on the negative side in the Y axis direction. The semiconductor device 100 includes the semiconductor substrate 10 having the transistor portion 70 including a transistor device such as an IGBT and the diode portion 80 including a diode device such as a freewheeling diode (FWD).

The semiconductor device 100 of the present example includes a gate trench portion 40, a dummy trench portion 30, a well region 130, an emitter region 12, a base region 14, and a contact region 15 provided inside the front surface side of the semiconductor substrate 10. Each of the gate trench portion 40 and the dummy trench portion 30 is an example of a trench portion.

In addition, the semiconductor device 100 of the present example includes the metal wiring 47 and the emitter electrode 52 provided above the front surface of the semiconductor substrate 10. The metal wiring 47 and the emitter electrode 52 are provided separately from each other. The metal wiring 47 and the emitter electrode 52 are electrically insulated from each other.

An interlayer dielectric film is provided between the emitter electrode 52 and the metal wiring 47, and the front surface of the semiconductor substrate 10, but is omitted in FIG. 4. In the interlayer dielectric film of the present example, contact holes 49, 54, and 56 are provided through the interlayer dielectric film. In FIG. 4, each contact hole is hatched with oblique lines.

The emitter electrode 52 is provided above the gate trench portion 40, the dummy trench portion 30, the well region 130, the emitter region 12, the base region 14, and the contact region 15. The emitter electrode 52 is electrically connected with the emitter region 12, the base region 14, and the contact region 15 in the front surface of the semiconductor substrate 10 by the contact hole 54.

In addition, the emitter electrode 52 is connected to a dummy conductive portion in the dummy trench portion 30 by the contact hole 56. A connection portion 25 formed of a material having conductivity such as polysilicon doped with impurities may be provided between the emitter electrode 52 and the dummy conductive portion. The connection portion 25 is provided in the front surface of the semiconductor substrate via a dielectric film such as an interlayer dielectric film and a dummy dielectric film of the dummy trench portion 30.

The metal wiring 47 is electrically connected to the polysilicon wiring 46 by the contact hole 49. The polysilicon wiring 46 is connected to the gate conductive portion in the gate trench portion 40 in the front surface of the semiconductor substrate 10. The polysilicon wiring 46 is not electrically connected to the dummy conductive portion in the dummy trench portion 30 and the emitter electrode 52.

The polysilicon wiring 46 and the emitter electrode 52 are electrically separated by an insulating material such as an interlayer dielectric film and an oxide film. The polysilicon wiring 46 of the present example is provided from below the contact hole 49 to the edge portion (the end portion in the Y axis direction) of the gate trench portion 40. At the edge portion of the gate trench portion 40, the gate conductive portion is exposed to the front surface of the semiconductor substrate 10 and is in connection with the polysilicon wiring 46.

The emitter electrode 52 is formed of a conductive material containing metal. For example, it is formed of aluminum or an aluminum-silicon alloy. Each electrode may have a barrier metal formed of titanium, a titanium compound, or the like in a lower layer of a region formed of aluminum or the like.

Each electrode may have a plug formed of tungsten or the like in the contact hole. The plug may have a barrier metal on the side in contact with the semiconductor substrate 10, may be embedded with tungsten so as to be in contact with the barrier metal, and may be formed of aluminum or the like on the tungsten.

Note that the plug is provided in the contact hole in contact with the contact region 15 or the base region 14. In addition, a P++ type plug region is formed below the contact hole of the plug so as to have a higher doping concentration than the contact region 15. This can improve the contact resistance between the barrier metal and the contact region 15. In addition, the depth of the plug region is about 0.1 μm or less, and has a region as small as 10% or less as the depth of the contact region 15.

By improving the contact resistance of the plug region, the latch-up withstand capability is improved in the operation of the transistor portion 70. On the other hand, in the operation of the diode portion 80, it is possible to suppress an increase in conduction loss and switching loss.

The well region 130 extends to the outside of the polysilicon wiring 46 so as to overlap the outer peripheral region, and is provided in an annular shape in a top view. The well region 130 also extends to the active portion 120 inside the polysilicon wiring 46 with a predetermined width, and is provided in an annular shape in a top view. The well region 130 of the present example is provided in a range separated from the end portion of the contact hole 54 in the Y axis direction on the polysilicon wiring 46 side. The well region 130 is a region of a second conductivity type having a higher doping concentration than the base region 14. The doping concentration of the well region 130 may be the same as or lower than the doping concentration of the contact region 15. The polysilicon wiring 46 is electrically insulated from the well region 130.

The base region 14 in the present example is a P− type, and the well region 130 is a P+ type. In addition, the well region 130 is formed from the front surface of the semiconductor substrate to a position deeper than the lower end of the base region 14. The base region 14 is provided in contact with the well region 130 in the transistor portion 70 and the diode portion 80. The well region 130 is electrically connected to the emitter electrode 52.

Each of the transistor portion 70 and the diode portion 80 has a plurality of trench portions arranged in the arrangement direction. In the transistor portion 70 of the present example, one or more gate trench portions 40 and one or more dummy trench portions 30 are alternately provided along the arrangement direction. In the diode portion 80 of the present example, a plurality of dummy trench portions 30 are provided along the arrangement direction.

In the present example, the arrangement direction of the trench portion is the X axis direction, and the extension direction perpendicular to the arrangement direction is the Y axis direction. The gate trench portion 40 of the present example may have two extension portions 39 (portions of the trenches which are straight along the extension direction) extending along the extension direction and a connection portion 41 connecting the two extension portions 39.

At least a part of the connection portion 41 may be provided in a curved shape in a top view. By connecting the end portions of the two extension portions 39 in the Y axis direction to the polysilicon wiring 46 by the connection portion 41, the connection portion 41 functions as a gate electrode to the gate trench portion 40. On the other hand, by forming the connection portion 41 in a curved shape, it is possible to reduce the electric field strength at the end portion rather than by being terminated by the extension portion 39.

In the transistor portion 70, the dummy trench portion 30 is provided between the respective extension portions 39 of the gate trench portion 40. In the example of FIG. 4, one dummy trench portion 30 is provided between the respective extension portions 39, but two or more dummy trench portions 30 may be provided.

In addition, the dummy trench portion 30 may not be provided between the respective extension portions 39, and the gate trench portion 40 may be provided. With such a structure, since the electron current from the emitter region 12 can be increased, the ON voltage is reduced.

The dummy trench portion 30 may have a linear shape extending in the extension direction, and may have an extension portion 29 and a connection portion 31 similar to the gate trench portion 40. In the semiconductor device 100 illustrated in FIG. 4, only the dummy trench portions 30 having the connection portion 31 are arranged, but in another example, the semiconductor device 100 may include a linear dummy trench portion 30 having no connection portion 31.

The diffusion depth of the well region 130 may be deeper than the depths of the gate trench portion 40 and the dummy trench portion 30. The end portions of the gate trench portion 40 and the dummy trench portion 30 in the Y axis direction are provided in the well region 130 in a top view. That is, the bottom portion of each trench portion in the depth direction (positive side in the Z axis direction) is covered with the well region 130 at the end portion of each trench portion in the Y axis direction. As a result, electric field strength at the bottom portion of each trench portion can be reduced.

A mesa portion is provided between the trench portions in the arrangement direction. The mesa portion refers to a region sandwiched between the trench portions inside the semiconductor substrate 10. As an example, the depth position of the mesa portion is from the front surface of the semiconductor substrate to the lower end of the trench portion.

The mesa portion of the present example is sandwiched between adjacent trench portions in the X axis direction, and is provided to extend in the extension direction (Y axis direction) along the trench in the front surface of the semiconductor substrate 10.

The base region 14 is provided in each mesa portion. In each mesa portion, at least one of the emitter region 12 of the first conductivity type and the contact region 15 of the second conductivity type may be provided in a region sandwiched between the base regions 14 in a top view. The emitter region 12 of the present example is an N+ type, and the contact region 15 is a P+ type. The emitter region 12 and the contact region 15 may be provided between the base region 14 and the front surface of the semiconductor substrate 10 in the depth direction. The dopant of the emitter region 12 is, for example, arsenic (As), phosphorus (P), antimony (Sb), or the like.

The mesa portion of the transistor portion 70 has the emitter region 12 exposed to the front surface of the semiconductor substrate 10. The emitter region 12 is provided in contact with the gate trench portion 40. The mesa portion in contact with the gate trench portion 40 is provided with the contact region 15 exposed to the front surface of the semiconductor substrate 10.

Each of the contact region 15 and the emitter region 12 in the mesa portion is provided from one trench portion to the other trench portion in the X axis direction. As an example, the contact regions 15 and the emitter regions 12 of the mesa portion are alternately disposed along the extension direction (Y axis direction) of the trench portion.

In another example, the contact region 15 and the emitter region 12 of the mesa portion may be provided in a stripe shape along the extension direction (Y axis direction) of the trench portion. For example, the emitter region 12 is provided in a region in contact with the trench portion, and the contact region 15 is provided in a region sandwiched between the emitter regions 12.

The emitter region 12 is not provided in the mesa portion of the diode portion 80. The base region 14 may be provided in the upper surface of the mesa portion of the diode portion 80. The base region 14 may be disposed in the entire mesa portion of the diode portion 80. The base region 14 of the diode portion 80 operates as an anode.

The contact hole 54 is provided above each mesa portion. The contact hole 54 is disposed in a region sandwiched between the base regions 14 in the extension direction (Y axis direction). The contact hole 54 of the present example is provided above each region of the contact region 15, the base region 14, and the emitter region 12. The contact hole 54 may be disposed at the center in the arrangement direction (X axis direction) of the mesa portion.

In the diode portion 80, an N+ type cathode region 82 is provided in a region adjacent to the back surface of the semiconductor substrate. In the back surface of the semiconductor substrate, a P+ type collector region 22 may be provided in a region where the cathode region 82 is not provided. In FIG. 4, the boundary between the cathode region 82 and the collector region 22 is indicated by a dotted line.

The cathode region 82 is disposed away from the well region 130 in the Y axis direction. As a result, by securing a distance between the cathode region 82 and the P type region (well region 130) having a relatively high doping concentration and formed up to a deep position, hole injection from the well region 130 can be suppressed, so that the reverse recovery loss can be reduced. The end portion of the cathode region 82 in the Y axis direction of the present example is disposed farther from the well region 130 than the end portion of the contact hole 54 in the Y axis direction. In another example, the end portion of the cathode region 82 in the Y axis direction may be disposed between the well region 130 and the contact hole 54.

Figure 5:
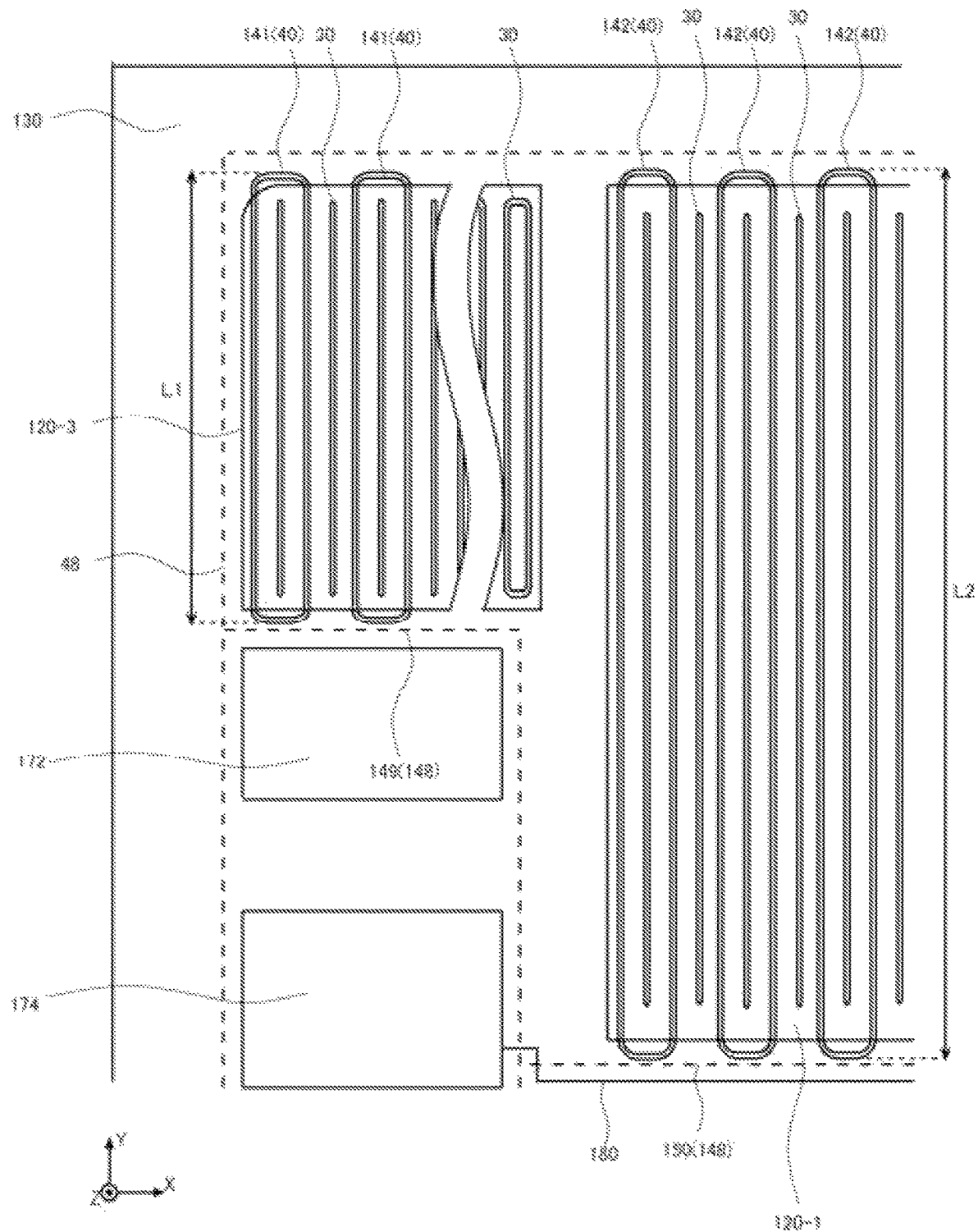
FIG. 5 illustrates an example of a top view of the semiconductor device 100.

FIG. 5 is an example of a top view of the semiconductor device 100. FIG. 5 describes the relationship between the gate trench portions 40 provided in the active portion 120-1 and the active portion 120-3 and the gate runner portions adjacent thereto.

The lengths of the active portion 120-1, the active portion 120-2, the active portion 120-3, the active portion 120-4, the active portion 120-5, and the active portion 120-6 in the Y axis direction are different. That is, the lengths (lengths in the Y axis direction) of the gate trench portions 40 provided in these active portions are also different.

In the present example, the gate trench portions 40 provided in the active portion 120-1 and the active portion 120-3 are set as a first trench portion 141 and a second trench portion 142, respectively. The predetermined length of the first trench portion 141 is set as a first trench length L1, and the predetermined length of the second trench portion 142 is set as a second trench length L2. In FIG. 5, the first trench length L1 and the second trench length L2 are the maximum lengths in the Y axis direction including the extension portion 39 and the connection portion 41, respectively, but may only correspond to the length of the extension portion 39 in another example. As illustrated in FIG. 5, the first trench length L1 is shorter than the second trench length L2.

The gate trench portion 40 is electrically connected to the gate runner portion via the contact hole 49 at the end portion in the extension direction. The first trench portion 141 and the second trench portion 142 are electrically connected to the outer peripheral gate runner portion 48 in the end portion on the positive side in the Y axis direction (extension direction), and the inner gate runner portion 148 in the end portion on the negative side in the Y axis direction. In the present example, in the inner gate runner portion 148, the portions electrically connected to the end portions of the first trench portion 141 and the second trench portion 142 on the negative side in the Y axis direction are set as a first gate runner portion 149 and a second gate runner portion 150, respectively. In FIG. 5, both the first gate runner portion 149 and the second gate runner portion 150 are the polysilicon wiring 146.

The resistance of the gate trench portion 40 is obtained from the sum of the resistance of the gate trench portion 40 itself and the resistance of the gate runner portion. The resistance of the gate trench portion 40 itself is calculated depending on the dimension and the number of the gate trench portions 40. The resistance of the gate runner portion is calculated from the resistivity per unit length and the length, and in a case where the gate runner portion has a polysilicon wiring and a metal wiring, it is calculated from the average value of the respective resistances.

The resistance of the gate trench portion 40 increases in proportion to the distance from the gate runner portion, and becomes maximum near the center in the extension direction. In such a high resistance portion of the gate trench portion 40, the channel remains open at the time of turn-off. Due to this delay, the electron current increases in the high resistance portion, and further the hole current attracted to the electron current is concentrated. Therefore, if the resistance difference between the gate trench portions 40 is large, the delay of the high resistance portion increases and the current further concentrates, which may cause fracture.

In order to prevent such current concentration, the resistivity per unit length of the first gate runner portion 149 is larger than the resistivity per unit length of the second gate runner portion 150. In the present example, the width of the first gate runner portion 149 is narrower than the width of the second gate runner portion 150. Here, the width of the gate runner portion means a dimension in a direction orthogonal to the extension direction.

In the present example, the first trench portion 141 and the second trench portion 142 are both connected to the polysilicon wiring 146, and the first trench length L1 is shorter than the second trench length L2, so that the maximum resistance value of the second trench portion 142 is larger than the maximum resistance value of the first trench portion 141. Therefore, by making the resistivity per unit length of the second gate runner portion 150 smaller than the resistivity per unit length of the first gate runner portion 149, the resistance difference between the first trench portion 141 and the second trench portion 142 can be reduced, the current concentration in the high resistance portion (near the center of the second trench portion 142 in the extension direction) can be suppressed, and the fracture can be prevented.

Alternatively, the second gate runner portion 150 may further include, in addition to the polysilicon wiring 146, a metal wiring which is provided at least partially above the polysilicon wiring 146 and electrically connected to the polysilicon wiring 146. On the other hand, since the metal wiring is not provided in the first gate runner portion 149, the resistance of the second gate runner portion 150 calculated from the average value of the resistances of the polysilicon wiring 146 and the metal wiring can be smaller than the resistance of the first gate runner portion 149, and the resistance difference between the first trench portion 141 and the second trench portion 142 can be reduced.

The difference between the resistivity per unit length of the first gate runner portion 149 and the resistivity per unit length of the second gate runner portion 150 may be set to be equal to or less than a predetermined threshold value. For example, the predetermined threshold value is 10%. In this way, by setting the resistance difference between the gate trench portions 40 to be equal to or less than a predetermined threshold value in this way, it is possible to suppress the concentration of current in the high resistance portion and prevent fracture.

Next, the configuration of the gate runner portion of the semiconductor device 100 for suppressing the concentration of current will be described with reference to FIG. 6 to FIG. 11. FIG. 6 to FIG. 11 each are partial sectional views of the semiconductor device 100 illustrated in FIG. 2. In the semiconductor device 100 of the present example, as described above, the polysilicon wiring 46 and the metal wiring 47 are provided as the outer peripheral gate runner portion 48, and the polysilicon wiring 146 is provided as the inner gate runner portion 148.

Figure 6:
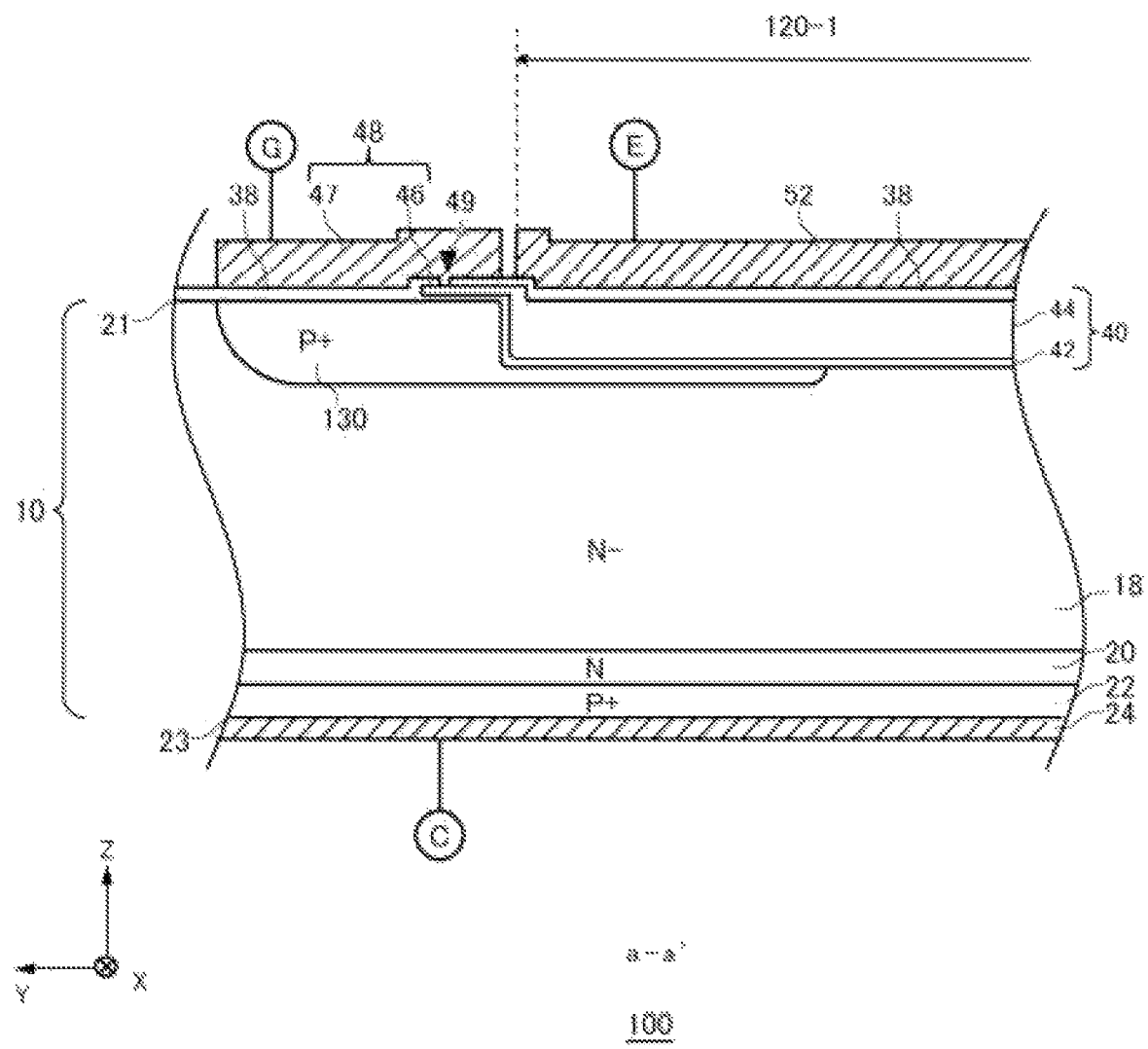
FIG. 6 is an example of a cross section a-a' of FIG. 2.

FIG. 6 is an example of a cross section a-a' of FIG. 2. The cross section a-a' is a YZ cross section that passes through the edge portions (end portions on the positive side in the Y axis direction) of the outer peripheral gate runner portion 48 and the gate trench portion 40. The semiconductor device 100 of the present example has the semiconductor substrate 10, an interlayer dielectric film 38, the emitter electrode 52, and a collector electrode 24 in the a-a' cross section.

The interlayer dielectric film 38 is provided in a front surface 21 of the semiconductor substrate 10. The interlayer dielectric film 38 is a dielectric film such as silicate glass to which an impurity such as boron or phosphorus is added. The interlayer dielectric film 38 may be in contact with the front surface 21, and another film such as an oxide film may be provided between the interlayer dielectric film 38 and the front surface 21. The interlayer dielectric film 38 is provided with the contact hole 49.

The emitter electrode 52 is provided in the front surface 21 of the semiconductor substrate 10 and the upper surface of the interlayer dielectric film 38. The collector electrode 24 is provided in a back surface 23 of the semiconductor substrate 10. The emitter electrode 52 and the collector electrode 24 are formed of a material containing metal or a stacked film thereof.

The semiconductor substrate 10 may be a silicon substrate, a silicon carbide substrate, a nitride semiconductor substrate such as gallium nitride, or the like. The semiconductor substrate 10 of the present example is a silicon substrate.

The semiconductor substrate 10 has a drift region 18 of the first conductivity type. The drift region 18 of the present example is an N− type. The drift region 18 may be a region which remains without providing another doping region in the semiconductor substrate 10.

Above the drift region 18, one or more accumulation regions may be provided in the Z axis direction. The accumulation region is a region in which the same dopant as the drift region 18 is accumulated at a higher concentration than the drift region. The doping concentration of the accumulation region is higher than the doping concentration of the drift region.

The accumulation region of the present example is an N type. The accumulation region may be provided only in the transistor portion 70, or may be provided in both the transistor portion 70 and the diode portion 80. By providing the accumulation region, the injection-enhancement effect (IE effect) of carriers can be enhanced, and the ON voltage can be reduced.

A buffer region 20 of the first conductivity type may be provided below the drift region 18. The buffer region 20 of the present example is an N type. The doping concentration of the buffer region 20 is higher than the doping concentration of the drift region 18. The buffer region 20 may function as a field stop layer that prevents a depletion layer extending from the lower surface side of the base region 14 from reaching the collector region 22 and the cathode region 82.

The collector region 22 is provided below the buffer region 20 in the transistor portion 70. The collector region 22 may be provided in contact with the cathode region 82 in the back surface 23.

In the diode portion 80, the cathode region 82 is provided below the buffer region 20. The cathode region 82 may be provided at the same depth as the collector region 22 of the transistor portion 70. The diode portion 80 may function as a freewheeling diode (FWD) that allows a freewheeling current that conducts in the reverse direction to flow when the transistor portion 70 is turned off.

The gate trench portion 40 is provided so as to reach the drift region 18 from the front surface 21. The gate trench portion 40 has a gate trench provided in the front surface 21, a gate dielectric film 42, and the gate conductive portion 44. The gate dielectric film 42 is provided to cover the inner wall of the gate trench. The gate dielectric film 42 may be formed of an oxide film or a nitride film.

The gate conductive portion 44 is provided in the gate trench so as to be embedded further inside than the gate dielectric film 42. The upper surface of the gate conductive portion 44 may be in the same XY plane as the front surface 21. The gate dielectric film 42 insulates the gate conductive portion 44 from the semiconductor substrate 10. The gate conductive portion 44 is formed of polysilicon doped with impurities.

The gate trench portion 40 is covered with the interlayer dielectric film 38 in the front surface 21. If a predetermined voltage is applied to the gate conductive portion 44, a channel by an inversion layer of electrons is formed in a surface layer of an interface in contact with the gate trench in the base region 14.

Although not illustrated in FIG. 6, the dummy trench portion 30 may have the same structure as the gate trench portion 40 in the XZ cross section. The dummy trench portion 30 has a dummy trench provided in the front surface 21, a dummy dielectric film, and a dummy conductive portion. The dummy dielectric film is provided to cover the inner wall of the dummy trench. The dummy dielectric film may be formed of an oxide film or a nitride film. The dummy conductive portion is provided in the dummy trench so as to be embedded further inside than the dummy dielectric film. The upper surface of the dummy conductive portion may be in the same XY plane as the front surface 21. The dummy dielectric film insulates the dummy conductive portion from the semiconductor substrate 10. The dummy conductive portion may be formed of the same material as the gate conductive portion 44.

The gate trench portion 40 and the dummy trench portion 30 of the present example are covered with the interlayer dielectric film 38 in the front surface 21. Note that the bottom portions of the dummy trench portion 30 and the gate trench portion 40 may have a curved surface shape protruding downward (a curved shape in a cross section).

The gate conductive portion 44 of the gate trench portion 40 is exposed to the front surface 21 of the semiconductor substrate 10 at the edge portion of the gate trench portion 40, and is electrically connected to the polysilicon wiring 46. The polysilicon wiring 46 is electrically connected to the metal wiring 47 provided above via the contact hole 49. The metal wiring 47 and the emitter electrode 52 are separated by a distance at which insulation is maintained.

In this way, the outer peripheral gate runner portion 48 has the metal wiring 47 while maintaining the insulation from the emitter electrode 52, thereby reducing the resistance of the entire gate runner portion.

Figure 7:
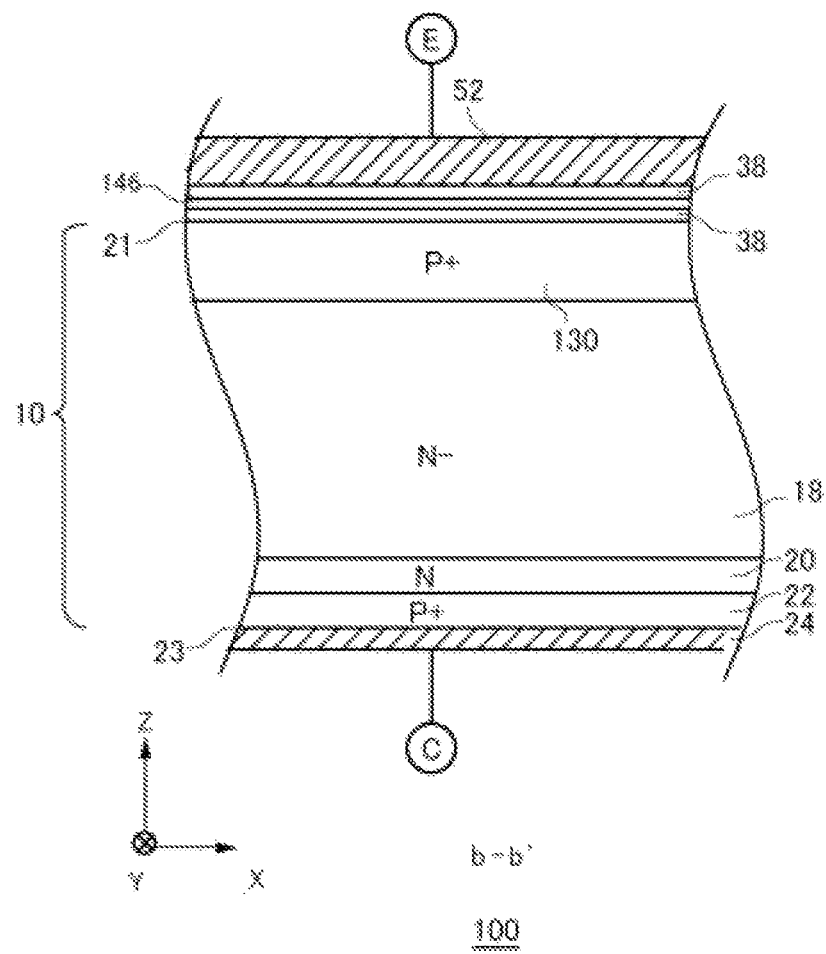
FIG. 7 is an example of a cross section b-b' of FIG. 2.

FIG. 7 is an example of a cross section b-b' of FIG. 2. The cross section b-b' is an XZ cross section that passes through an inner gate runner portion 148 extending in the X axis direction between the active portion 120-3 and the pad region.

Figure 8:
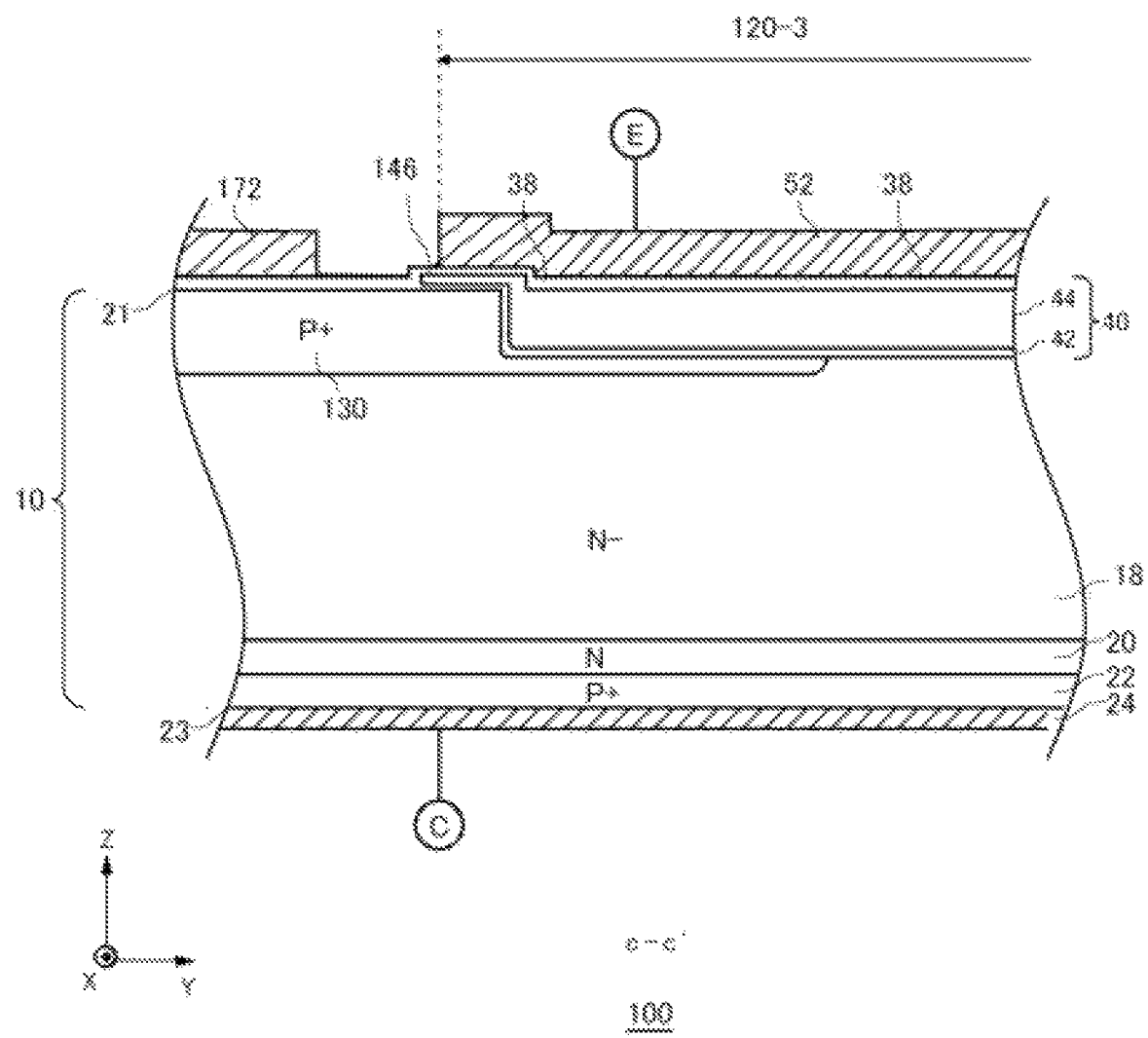
FIG. 8 is an example of a cross section c-c' of FIG. 2.

FIG. 8 is an example of a cross section c-c' of FIG. 2. The cross section c-c' is a YZ cross section that passes through the inner gate runner portion 148 extending in the X axis direction between the active portion 120-3 and the pad region, similarly to the cross section b-b'. In addition, the cross section c-c' passes through the edge portion (end portion on the negative side in the Y axis direction) of the gate trench portion 40 provided in the active portion 120-3.

As illustrated in FIG. 7 and FIG. 8, the gate conductive portion 44 of the gate trench portion 40 is exposed to the front surface 21 of the semiconductor substrate 10 at the edge portion of the gate trench portion 40, and is electrically connected to the polysilicon wiring 146.

In this way, even in a region where the emitter electrode 52 and other electrodes (the current sense pad 172 and the like) are close to each other and a space for providing the metal wiring cannot be secured, the polysilicon wiring 146 is provided as the inner gate runner portion 148 so as to assist the outer peripheral gate runner portion 48.

Figure 9:
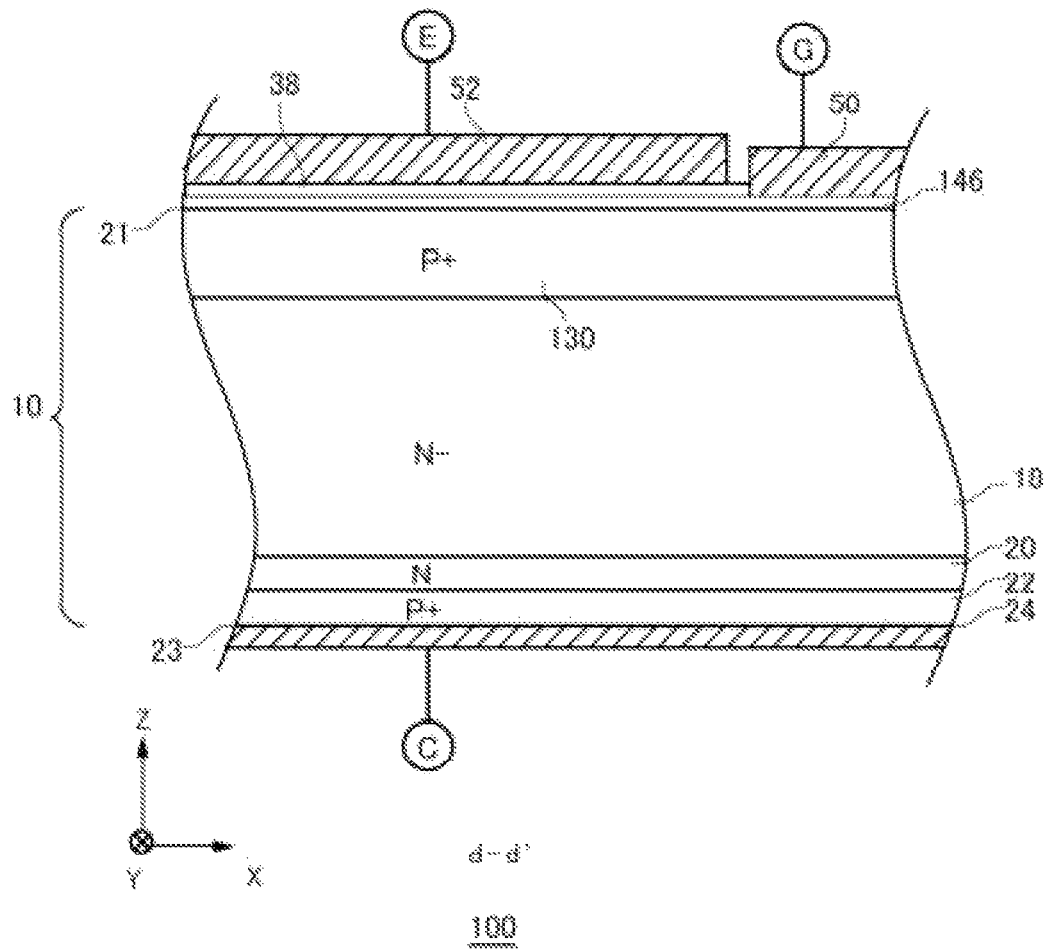
FIG. 9 is an example of a cross section d-d' of FIG. 2.

FIG. 9 is an example of a cross section d-d' of FIG. 2. The cross section d-d' is an XZ cross section of the inner gate runner portion 148 extending in the X axis direction between the active portion 120-1 and the active portion 120-2. The cross section d-d' passes near the gate pad 50. The emitter electrode 52 and the gate pad 50 are provided above the semiconductor substrate 10. The polysilicon wiring 146 is insulated from the emitter electrode 52 by the interlayer dielectric film 38, but is electrically connected to the gate pad 50.

Figure 10:
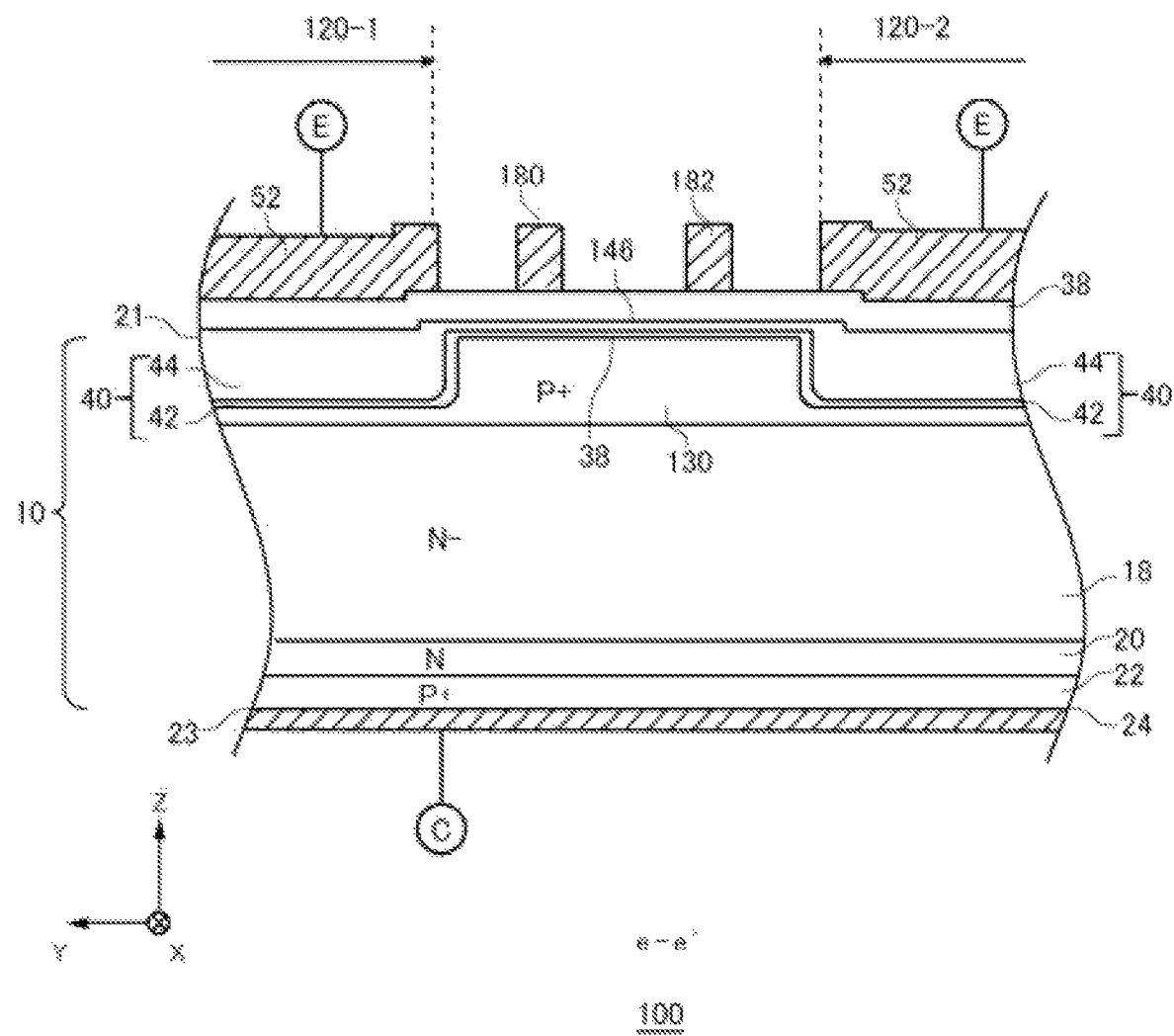
FIG. 10 is an example of a cross section e-e' of FIG. 2.

FIG. 10 is an example of the cross section e-e' of FIG. 2. The cross section e-e' is a YZ cross section of the inner gate runner portion 148 extending in the X axis direction between the active portion 120-1 and the active portion 120-2. The cross section e-e' passes between the pad region and the temperature sense portion 178. In the active portion 120-1 and the active portion 120-2, the emitter electrode 52 is provided above the semiconductor substrate 10. A pair of the anode wiring 180 and the cathode wiring 182 is provided between the emitter electrodes 52.

The polysilicon wiring 146 is provided so as to straddle the edge portion of the gate trench portion 40 provided in the active portion 120-1 and the active portion 120-2. The gate conductive portion 44 of the gate trench portion 40 provided in the active portion 120-1 and the active portion 120-2 is exposed to the front surface 21 of the semiconductor substrate 10 at the edge portion of the gate trench portion 40, and is electrically connected to the polysilicon wiring 146.

Figure 11:
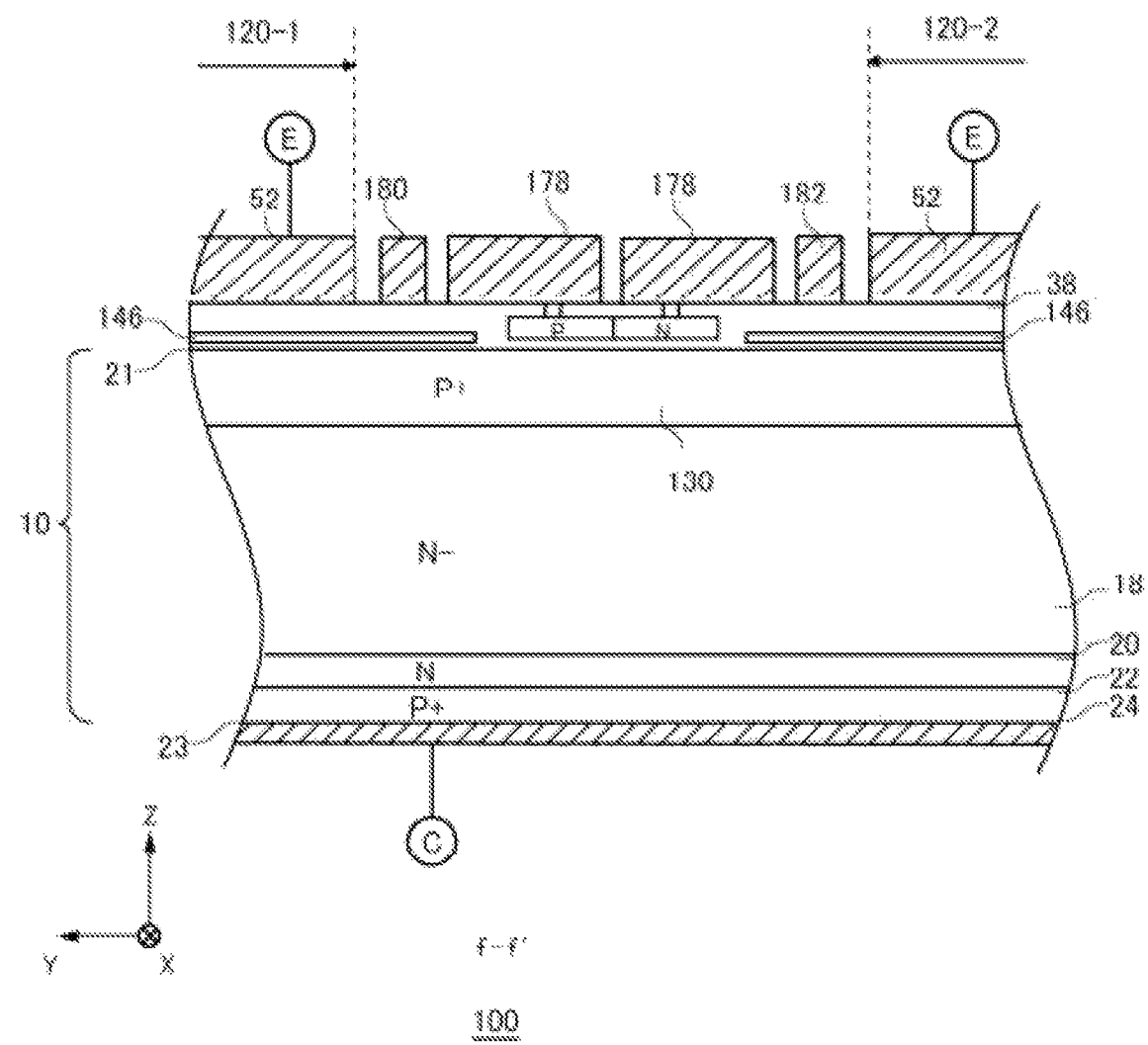
FIG. 11 is an example of a cross section f-f' of FIG. 2.

FIG. 11 is an example of the cross section f-f of FIG. 2. The cross section f-f is a YZ cross section of the inner gate runner portion 148 extending in the X axis direction between the active portion 120-1 and the active portion 120-2. The cross section f-f passes through the temperature sense portion 178. Unlike the cross section e-e' illustrated in FIG. 10, the temperature sense portion 178 is provided between the anode wiring 180 and the cathode wiring 182.

The temperature sense portion 178 has a PN junction diode made of polycrystalline silicon provided above the semiconductor substrate 10 via the interlayer dielectric film 38. The polysilicon wiring 146 branches in the vicinity of the PN junction diode and extends so as to surround the PN junction diode. As a result, the polysilicon wiring 146 secures insulation from the temperature sense portion 178.

The width of the polysilicon wiring 146 adjacent to the temperature sense portion 178 is equal to or larger than the width of the polysilicon wiring 146 of the first gate runner portion 149 illustrated in FIG. 5. Here, the polysilicon wiring 146 adjacent to the temperature sense portion 178 means the width of the polysilicon wiring 146 surrounding the PN junction diode.

The central portion of the semiconductor substrate 10 provided with the temperature sense portion 178 is likely to cause fracture by heat generated from the switching device formed in the active portion 120. In addition, the gate trench portion 40 provided in the active portion 120-1 and the active portion 120-2 has a shorter trench length in the vicinity of the temperature sense portion 178. In the region where the trench length changes, the current is concentrated at the time of turn-off, and the fracture is likely to occur. Therefore, by increasing the width of the adjacent polysilicon wiring 146, the resistance of the gate trench portion 40 in the vicinity of the temperature sense portion 178 is reduced, and the current concentration at the time of turn-off is prevented.

In this way, the semiconductor device 100 of the present example includes a gate runner portion provided so as to reduce the resistance difference between the gate trench portions 40. Here, the outer peripheral gate runner portion 48 has the metal wiring 47 and the polysilicon wiring 46, and the inner gate runner portion 148 has only the polysilicon wiring 146, but the resistance difference between the gate trench portions 40 is not limited thereto as long as the resistance difference is below a predetermined threshold value.

The outer peripheral gate runner portion 48 may have only the metal wiring 47 without having the polysilicon wiring 46. Alternatively, the inner gate runner portion 148 may further have a metal wiring in addition to the polysilicon wiring 146 in a region where a sufficient distance required for insulation can be secured between the emitter electrode 52 and other electrodes.

Figure 12:
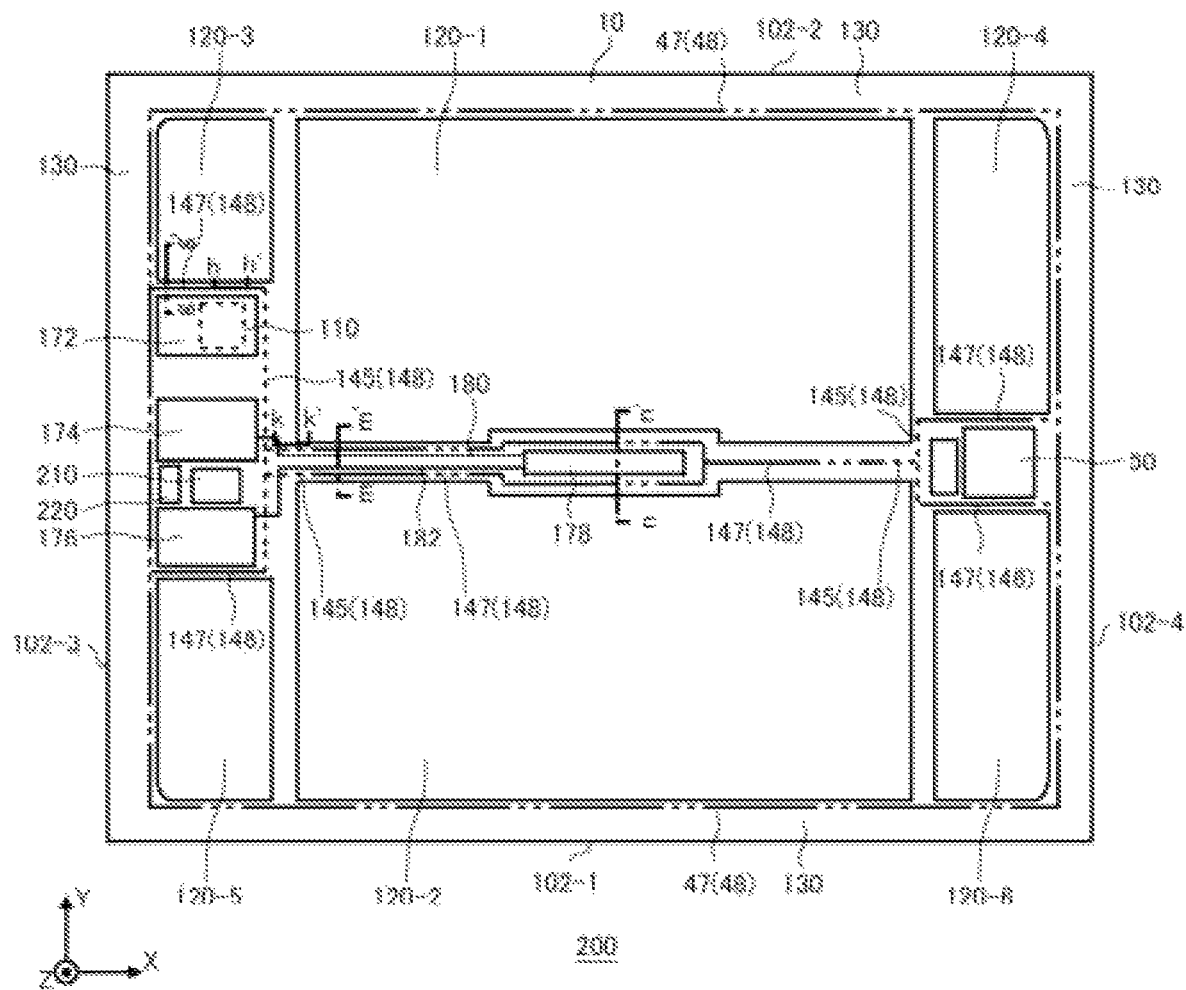
FIG. 12 illustrates an example of an arrangement of a gate runner portion in the front surface of a semiconductor device 200 according to an example embodiment 2.

FIG. 12 illustrates an example of the arrangement of the gate runner portion in the front surface of a semiconductor device 200 according to an example embodiment 2. In the semiconductor device 200, unlike the semiconductor device 100, at least a part of the inner gate runner portion 148 has the polysilicon wiring 146 and a metal wiring 147. In the semiconductor device 200, the portions common to the semiconductor device 100 are denoted by the same reference numerals, and the description thereof is omitted.

Figure 13:
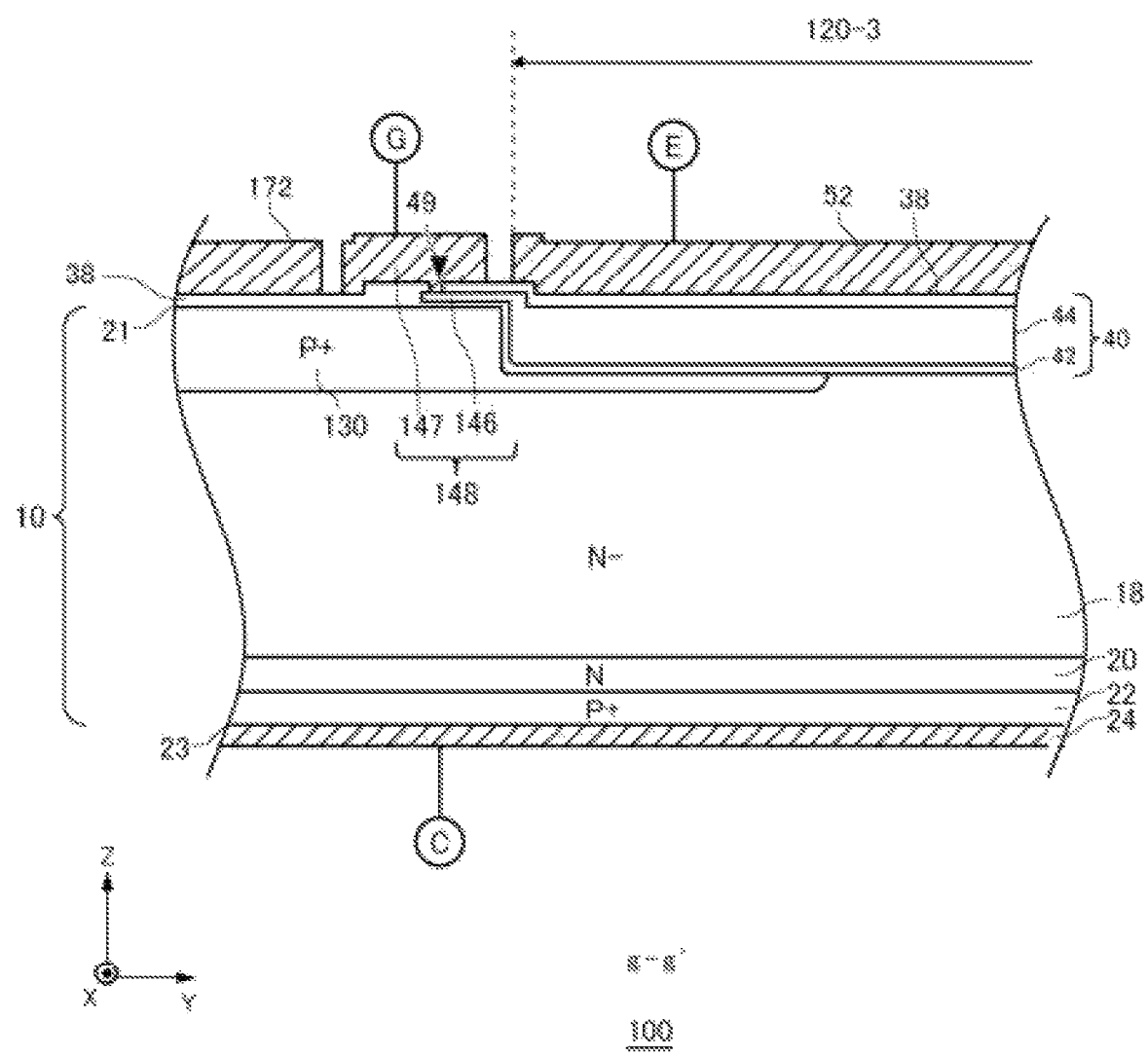
FIG. 13 is an example of a cross section g-g' of FIG. 12.

FIG. 13 is an example of the cross section g-g' of FIG. 12. The cross section g-g' is a YZ cross section that passes through the inner gate runner portion 148 extending in the X axis direction between the active portion 120-3 and the pad region. In addition, the cross section g-g' passes through the edge portion (end portion on the negative side in the Y axis direction) of the gate trench portion 40 provided in the active portion 120-3. The gate conductive portion 44 of the gate trench portion 40 is exposed to the front surface 21 of the semiconductor substrate 10 at the edge portion of the gate trench portion 40, and is electrically connected to the polysilicon wiring 146.

Figure 14:
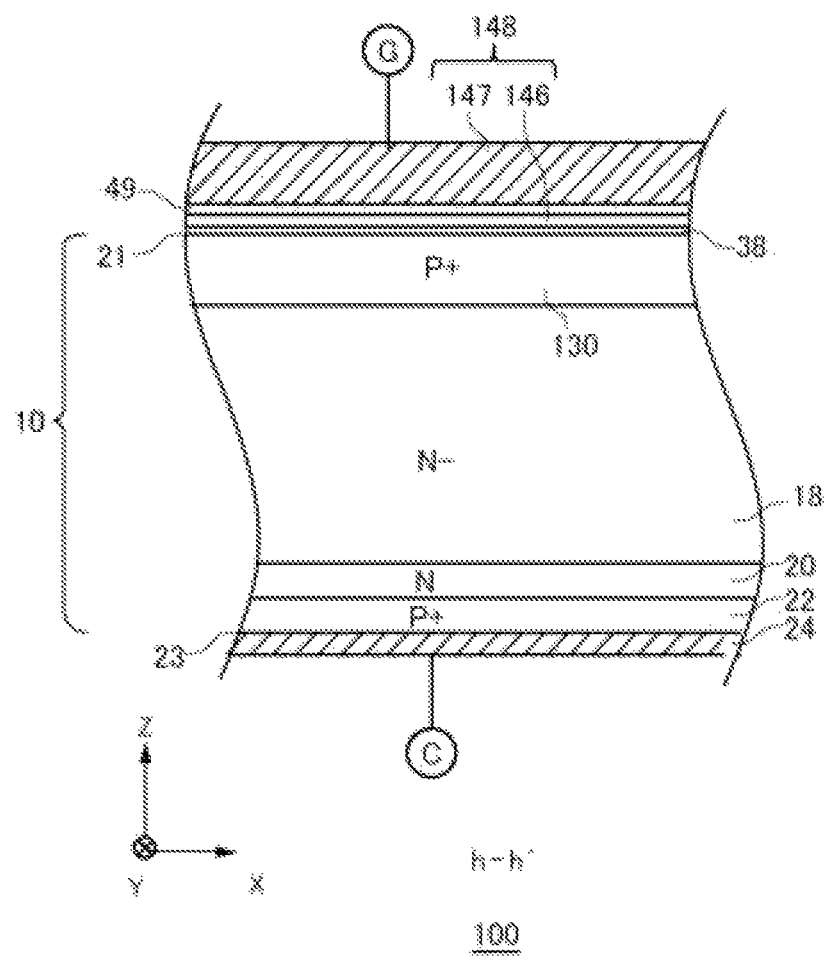
FIG. 14 is an example of a cross section h-h' of FIG. 12.

FIG. 14 is an example of the cross section h-h' of FIG. 12. The cross section h-h' is an XZ cross section that passes through the inner gate runner portion 148 extending in the X axis direction between the active portion 120-3 and the pad region.

As illustrated in FIG. 13 and FIG. 14, the metal wiring 147 extends above the polysilicon wiring 146 and is electrically connected to the polysilicon wiring 146 via the contact hole 49. The metal wiring 147 is provided apart from the emitter electrode 52 and other electrodes. In this way, the inner gate runner portion 148 further includes the metal wiring 147, so that the resistance of the gate trench portion 40 can be reduced.

Figure 15:
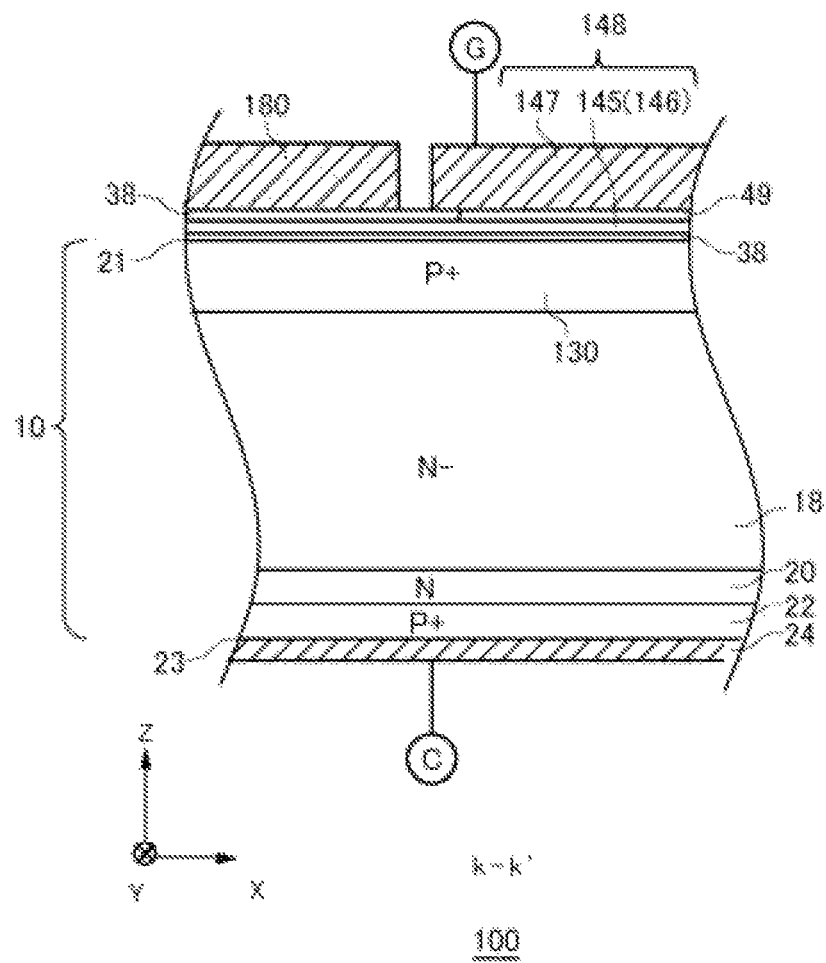
FIG. 15 is an example of a cross section k-k' of FIG. 12.

FIG. 15 is an example of a cross section k-k' of FIG. 12. The cross section k-k' is an XZ cross section of the inner gate runner portion 148 extending in the X axis direction between the active portion 120-1 and the active portion 120-2. The cross section k-k' passes between the pad region and the temperature sense portion 178, and passes through the anode wiring 180 near the inner gate runner portion 148 in the vicinity of the pad region.

On the positive side of the pad region in the X axis direction, the gate runner portion may be close to the emitter electrode 52 or the anode wiring 180 and the cathode wiring 182. In such a region, it is difficult to provide the metal wiring 147 because there is a risk of a short circuit.

The semiconductor device 200 of the present example further includes a polysilicon bridge portion 145 that electrically connects the metal wirings 147 to each other. The polysilicon bridge portion 145 may be a part of the polysilicon wiring 146 and may be a separate member made of polysilicon. The polysilicon bridge portion 145 is electrically connected to the metal wiring 147 provided above via the contact hole 49.

In FIG. 15, the metal wiring 147 is provided to the extent that insulation from the anode wiring 180 can be secured. In the region where the metal wiring 147 is not provided, the polysilicon bridge portion 145 is provided below the anode wiring 180. Note that, although not illustrated, the metal wiring 147 may be provided to the extent that insulation can also be secured from the cathode wiring 182, and the polysilicon bridge portion 145 may also be provided below the cathode wiring 182. In addition, in a case where the anode wiring 180 and the cathode wiring 182 are not provided, only one metal wiring 147 may be provided.

The polysilicon bridge portion 145 may be further provided between the metal wiring 147 extending in the X axis direction between the active portion 120-1 and the active portion 120-2 and the metal wiring 147 surrounding the gate pad 50.

Since the temperature sense wiring is not provided in the vicinity of the gate pad 50 unlike the vicinity of the pad region, it is possible to provide a metal wiring from the viewpoint of insulation. However, by providing the polysilicon bridge portion 145 in the vicinity of the gate pad 50 instead of the metal wiring 147, the configuration of the gate runner portion becomes symmetrical on both sides of the temperature sense portion 178, and the concentration of current due to imbalance can be prevented.

Figure 16:
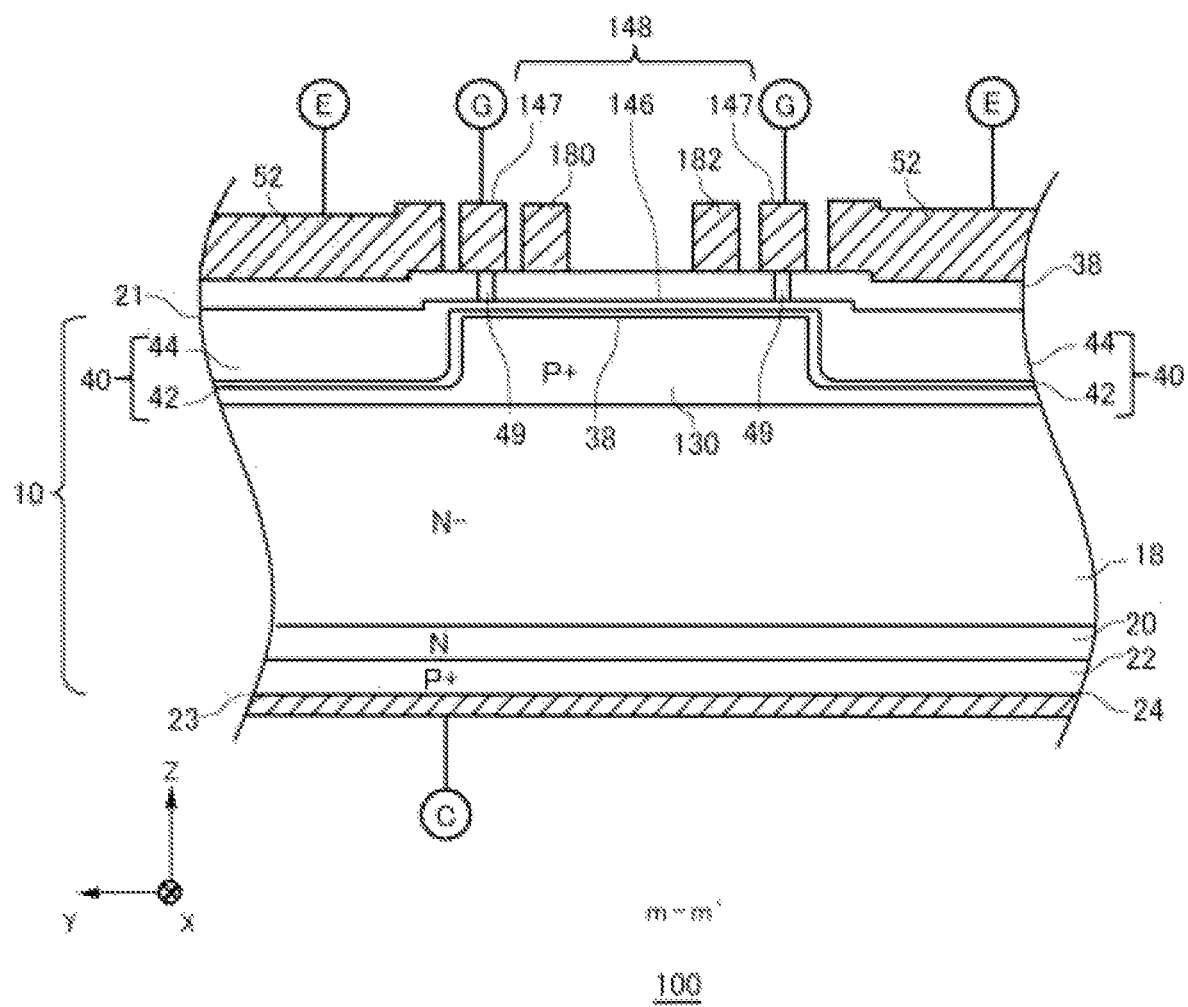
FIG. 16 is an example of a cross section m-m' of FIG. 12.

FIG. 16 is an example of the cross section m-m' of FIG. 12. The cross section m-m' is a YZ cross section of the inner gate runner portion 148 extending in the X axis direction between the active portion 120-1 and the active portion 120-2. The cross section m-m' passes between the pad region and the temperature sense portion 178. In the active portion 120-1 and the active portion 120-2, the emitter electrode 52 is provided above the semiconductor substrate 10. A pair of the anode wiring 180 and the cathode wiring 182 is provided between the emitter electrodes 52.

The polysilicon wiring 146 is provided so as to straddle the edge portion of the gate trench portion 40 provided in the active portion 120-1 and the active portion 120-2. The gate conductive portion 44 of the gate trench portion 40 provided in the active portion 120-1 and the active portion 120-2 is exposed to the front surface 21 of the semiconductor substrate 10 at the edge portion of the gate trench portion 40, and is electrically connected to the polysilicon wiring 146.

The metal wiring 147 is provided between the emitter electrode 52 and the anode wiring 180, and between the emitter electrode 52 and the cathode wiring 182. The metal wiring 147 is separated from each of the emitter electrode 52, the anode wiring 180, and the cathode wiring 182 so as to sufficiently secure the distance required for insulation.

Figure 17:
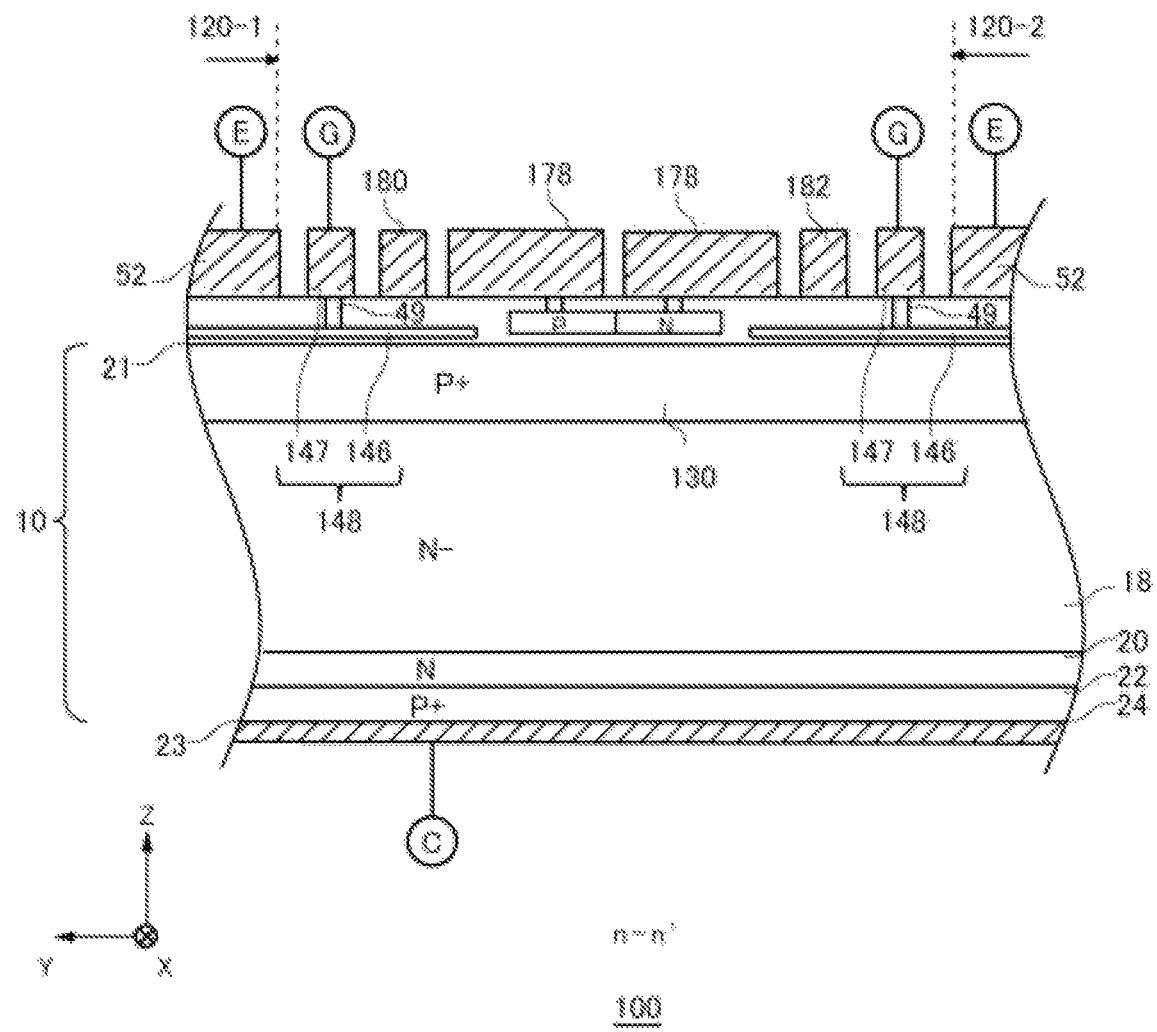
FIG. 17 is an example of a cross section n-n' of FIG. 12.

The metal wiring 147 extends above the polysilicon wiring 146 and is electrically connected to the polysilicon wiring 146 via the contact hole 49. In this way, the inner gate runner portion 148 further includes the metal wiring 147, so that the resistance of the gate trench portion 40 can be reduced. FIG. 17 is an example of the cross section n-n' of FIG. 12. The cross section n-n' is a YZ cross section of the inner gate runner portion 148 extending in the X axis direction between the active portion 120-1 and the active portion 120-2. The cross section n-n' passes through the temperature sense portion 178.

The polysilicon wiring 146 branches in the vicinity of the PN junction diode and extends so as to surround the PN junction diode. As a result, the polysilicon wiring 146 secures insulation from the temperature sense portion 178.

Similar to FIG. 16, the metal wiring 147 is provided between the emitter electrode 52 and the anode wiring 180, and between the emitter electrode 52 and the cathode wiring 182. The metal wiring 147 is separated from each of the emitter electrode 52, the anode wiring 180, and the cathode wiring 182 so as to sufficiently secure the distance required for insulation.

The metal wiring 147 extends above the polysilicon wiring 146 and is electrically connected to the polysilicon wiring 146 via the contact hole 49. In this way, the inner gate runner portion 148 further includes the metal wiring 147, so that the resistance of the gate trench portion 40 can be reduced.

Figure 18:
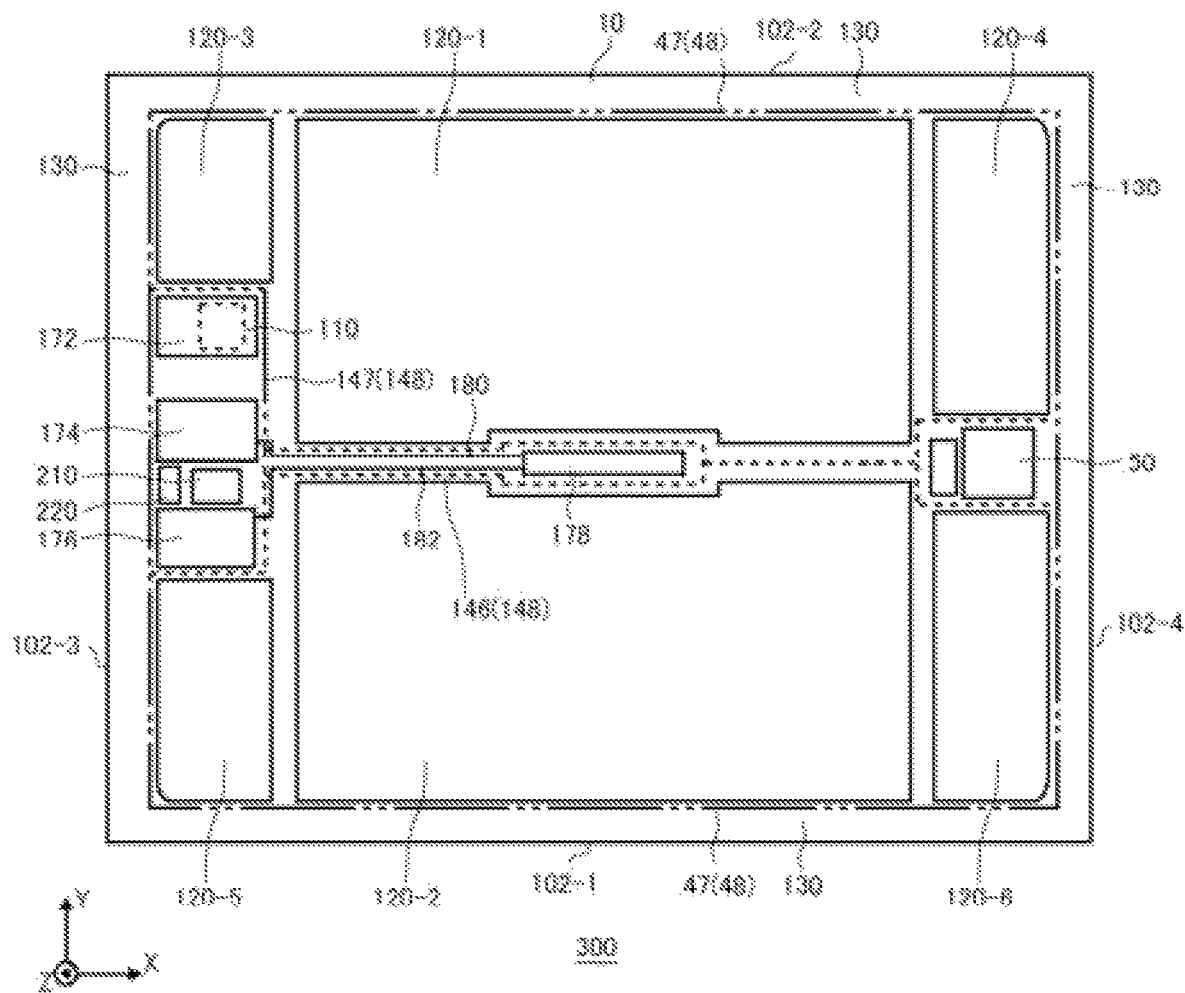
FIG. 18 illustrates an example of an arrangement of a gate runner portion in the front surface of a semiconductor device 300 according to an example embodiment 3.

FIG. 18 illustrates an example of the arrangement of the gate runner portion in the front surface of a semiconductor device 300 according to an example embodiment 3. In the semiconductor device 300, the portions common to the semiconductor device 100 are denoted by the same reference numerals, and the description thereof is omitted.

In the semiconductor device 300, the inner gate runner portion 148 has mostly only the polysilicon wiring 146, and locally has the metal wiring 147. In the present example, the metal wiring 147 extends in the Y axis direction along the end portion of the pad region on the positive side in the X axis direction. The pad region on the positive side in the X axis direction is the boundary between the active portion 120-3 and the active portion 120-1. As described with reference to FIG. 5, the length of the gate trench portion 40 changes from a trench length L1 to a trench length L2 with this position as a boundary. As described above, in the region where the trench length changes, the current is concentrated at the time of turn-off, and the fracture is likely to occur.

Therefore, the inner gate runner portion 148 has at least the metal wiring 147 along the end portion on the positive side in the X axis direction of the pad region, thereby reducing the resistance of the gate runner portion in the region where the trench length changes. In this way, even in a case where the inner gate runner portion 148 is formed of the polysilicon wiring 146 due to safety restrictions, the current concentration at the time of turn-off is prevented by locally providing the metal wiring 147.

Figure 19:
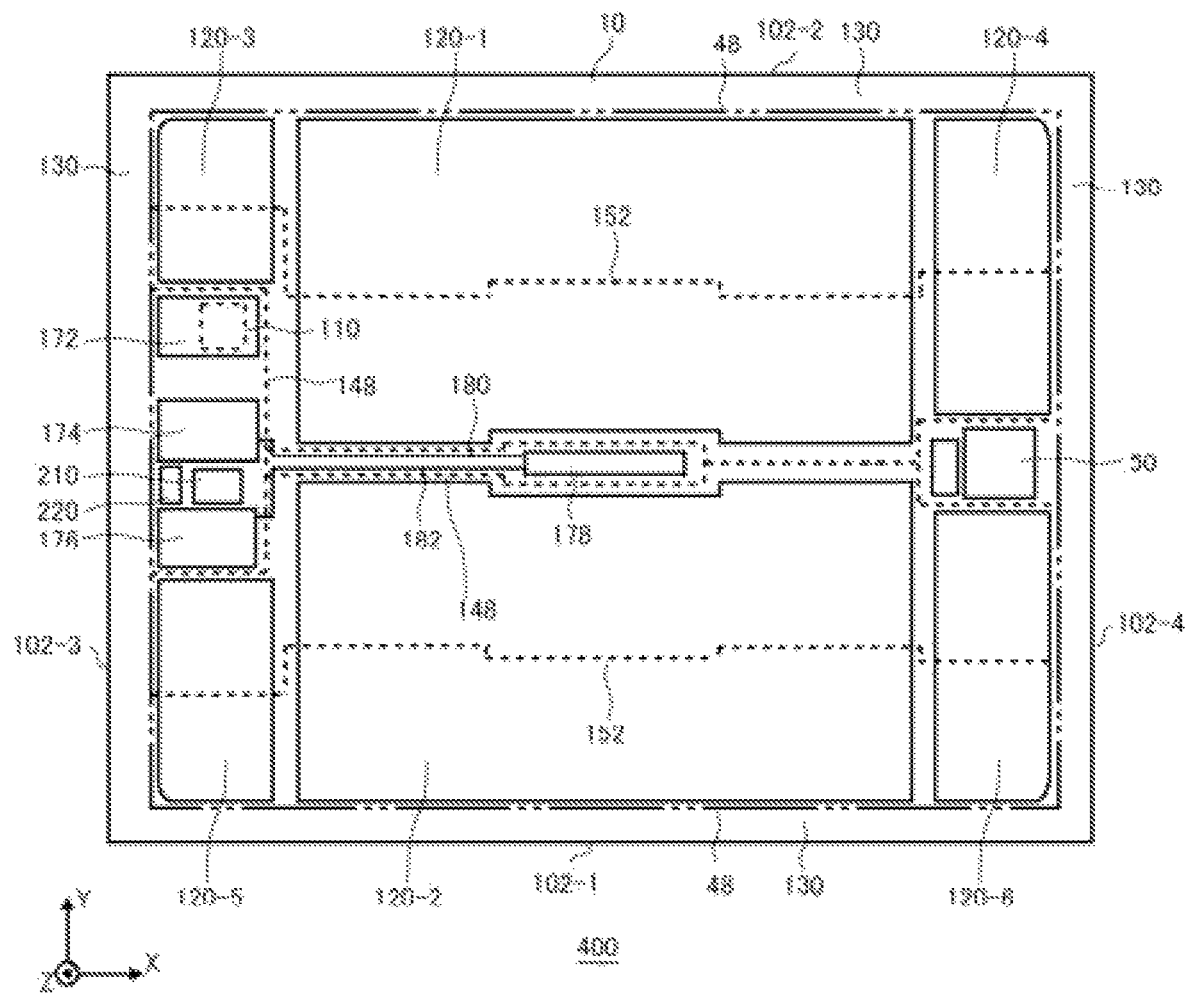
FIG. 19 illustrates an example of an arrangement of a gate runner portion in the front surface of a semiconductor device 400 according to an example embodiment 4.

FIG. 19 illustrates an example of the arrangement of the gate runner portion in the front surface of a semiconductor device 400 according to an example embodiment 4. In the semiconductor device 400, the portions common to the semiconductor device 100 are denoted by the same reference numerals, and the description thereof is omitted.

The semiconductor device 400 further includes an additional gate runner portion 152 that is provided above the gate trench portion 40 and is electrically connected to the gate trench portion 40. Here, the "above" of the gate trench portion 40 means the +Z axis direction in the range between the end portions of the gate trench portion 40 in the Y axis direction in a top view. The additional gate runner portion 152 is electrically connected to the gate trench portion 40 via a contact hole (not illustrated).

The additional gate runner portion 152 may extend over the active portion 120-3, the active portion 120-1, and the active portion 120-4, may be provided above the first trench portion 141 and the second trench portion 142 illustrated in FIG. 5, and may be electrically connected to each of the first trench portion 141 and the second trench portion 142. The additional gate runner portion 152 extending over the active portion 120-5, the active portion 120-2, and the active portion 120-6 may be further provided.

The additional gate runner portion 152 may have at least one of the polysilicon wiring 146 and the metal wiring 147, similarly to the inner gate runner portion 148. In the case of having the polysilicon wiring 146, the gate conductive portion 44 may be exposed to the front surface 21 of the semiconductor substrate 10 at the position where the polysilicon wiring 146 and the gate trench portion 40 overlap, and the polysilicon wiring 146 and the gate conductive portion 44 may be electrically connected to each other. The metal wiring 147 may be electrically connected to the gate conductive portion 44 via the contact hole.

The additional gate runner portion 152 may be extended so as to pass through the center of the gate trench portion 40 in the extension direction. For example, the additional gate runner portion 152 extends so as to pass through the center of the first trench length L1 and the second trench length L2 illustrated in FIG. 5. That is, the additional gate runner portion 152 extends the center, which is in the Y axis direction of the gate trench portion 40 in the active portion 120, in the X axis direction and, between the active portions 120, extends in the Y axis direction so as to adjust the position in the Y axis direction.

As described above, the resistance of the gate trench portion 40 increases in proportion to the distance from the gate runner portion and becomes maximum near the center in the extension direction. Therefore, by providing the additional gate runner portion 152 and shortening the maximum distance from the gate runner portion, the resistance difference between the gate trench portions 40 can be reduced, the current concentration in the high resistance portion can be suppressed, and fracture can be prevented.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10: semiconductor substrate; 12: emitter region; 14: base region; 15: contact region; 18: drift region; 20: buffer region; 21: front surface; 22: collector region; 23: back surface; 24: collector electrode; 25: connection portion; 29: extension portion; 30: dummy trench portion; 31: connection portion; 38: interlayer dielectric film; 39: extension portion; 40: gate trench portion; 41: connection portion; 42: gate dielectric film; 44: gate conductive portion; 46: polysilicon wiring; 47: metal wiring; 48: outer peripheral gate runner portion; 49: contact hole; 50: gate pad; 52: emitter electrode; 54: contact hole; 56: contact hole; 70: transistor portion; 80: diode portion; 82: cathode region; 90: separation portion; 100: semiconductor device; 102: end side; 110: current sense portion; 120: active portion; 130: well region; 141: first trench portion; 142: second trench portion; 145: polysilicon bridge portion; 146: polysilicon wiring; 147: metal wiring; 148: inner gate runner portion; 149: first gate runner portion; 150: second gate runner portion; 152: additional gate runner portion; 172: current sense pad; 174: anode pad; 176: cathode pad; 178: temperature sense portion; 180: anode wiring; 182: cathode wiring; 200: semiconductor device; 203: main metal portion; 210: bidirectional diode portion; 220: output comparison diode portion; 300: semiconductor device; 400: semiconductor device

What is claimed is:

1. A semiconductor device comprising:
   a first trench having a predetermined first trench length;
   a second trench having a second trench length longer than the first trench length;
   a first gate runner configured to be electrically connected to an end of the first trench; and
   a second gate runner configured to be electrically connected to the first gate runner and electrically connected to an end of the second trench, wherein
   a resistivity per unit length of the first gate runner is larger than a resistivity per unit length of the second gate runner.

2. The semiconductor device according to claim 1, wherein
   a width of the first gate runner is narrower than a width of the second gate runner.

3. The semiconductor device according to claim 2, wherein
   the second gate runner has a polysilicon wiring and a metal wiring which is provided at least partially above the polysilicon wiring and electrically connected to the polysilicon wiring.

4. The semiconductor device according to claim 2, further comprising:
   an additional gate runner configured to be provided above the first trench and the second trench and electrically connected to each of the first trench and the second trench.

5. The semiconductor device according to claim 2, wherein
   a difference between the resistivity per unit length of the first gate runner and the resistivity per unit length of the second gate runner is 10% or less.

6. The semiconductor device according to claim 1, wherein
   the second gate runner has a polysilicon wiring and a metal wiring which is provided at least partially above the polysilicon wiring and electrically connected to the polysilicon wiring.

7. The semiconductor device according to claim 6, wherein
   the metal wiring is not provided in the first gate runner.

8. The semiconductor device according to claim 7, further comprising:
   a polysilicon bridge portion configured to electrically connect the metal wirings to each other.

9. The semiconductor device according to claim 7, further comprising:
   an additional gate runner configured to be provided above the first trench and the second trench and electrically connected to each of the first trench and the second trench.

10. The semiconductor device according to claim 6, further comprising:
    a polysilicon bridge portion configured to electrically connect the metal wirings to each other.

11. The semiconductor device according to claim 10, further comprising:
    a temperature sense portion; and
    a temperature sense pad configured to be connected to the temperature sense portion via a temperature sense wiring, wherein
    the polysilicon bridge portion is provided below the temperature sense wiring located between the metal wirings.

12. The semiconductor device according to claim 11, wherein
    the metal wiring is provided in a trench extension direction along the temperature sense pad.

13. The semiconductor device according to claim 12, wherein
    a width of the polysilicon wiring adjacent to the temperature sense portion is equal to or larger than a width of the polysilicon wiring of the first gate runner.

14. The semiconductor device according to claim 11, wherein
    a width of the polysilicon wiring adjacent to the temperature sense portion is equal to or larger than a width of the polysilicon wiring of the first gate runner.

15. The semiconductor device according to claim 11, further comprising:
    an additional gate runner configured to be provided above the first trench and the second trench and electrically connected to each of the first trench and the second trench.

16. The semiconductor device according to claim 10, further comprising:
    an additional gate runner configured to be provided above the first trench and the second trench and electrically connected to each of the first trench and the second trench.

17. The semiconductor device according to claim 6, further comprising:
    an additional gate runner configured to be provided above the first trench and the second trench and electrically connected to each of the first trench and the second trench.

18. The semiconductor device according to claim 1, further comprising:
    an additional gate runner configured to be provided above the first trench and the second trench and electrically connected to each of the first trench and the second trench.

19. The semiconductor device according to claim 18, wherein
    the additional gate runner is configured to extend so as to pass through a center of the first trench length and the second trench length.

20. The semiconductor device according to claim 1, wherein
    a difference between the resistivity per unit length of the first gate runner and the resistivity per unit length of the second gate runner is 10% or less.

* * * * *